(12) United States Patent
Tanaka

(10) Patent No.: US 11,119,201 B2
(45) Date of Patent: Sep. 14, 2021

(54) DISTANCE DETECTING APPARATUS, IMAGE CAPTURING APPARATUS, DISTANCE DETECTING METHOD, AND STORAGE MEDIUM

(71) Applicant: CANON KABUSHIKI KAISHA, Tokyo (JP)

(72) Inventor: Shin Tanaka, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/162,547

(22) Filed: Oct. 17, 2018

(65) Prior Publication Data
US 2019/0120950 A1 Apr. 25, 2019

(30) Foreign Application Priority Data

Oct. 24, 2017 (JP) .............................. JP2017-205547

(51) Int. Cl.
*H04N 7/12* (2006.01)
*G01S 11/12* (2006.01)
(Continued)

(52) U.S. Cl.
CPC ................ *G01S 11/12* (2013.01); *G02B 7/34* (2013.01); *G06T 7/32* (2017.01); *G06T 7/593* (2017.01); *H01L 27/14645* (2013.01); *H04N 5/23212* (2013.01); *H04N 5/357* (2013.01); *H04N 5/3696* (2013.01); *G03B 13/36* (2013.01); *G06T 2207/10012* (2013.01);
(Continued)

(58) Field of Classification Search
CPC .. G01C 3/08; G01S 11/12; G02B 7/34; G06T 7/32; G06T 7/593; G06T 2207/10012; G06T 2207/10024; H04N 5/23212; H04N 5/232122; H04N 5/357; H04N 5/3696; G03B 13/36; H01L 27/14645; H01L 27/14621; H01L 27/14623; H01L 27/14627
See application file for complete search history.

(56) References Cited

U.S. PATENT DOCUMENTS

2011/0234765 A1* 9/2011 Tanaka ................. H04N 13/239
348/47
2012/0163720 A1* 6/2012 Saito ......................... G06T 3/40
382/195
(Continued)

FOREIGN PATENT DOCUMENTS

JP 2003-269917 A 9/2003
JP 2011-007882 A 1/2011
(Continued)

*Primary Examiner* — Peet Dhillon
(74) *Attorney, Agent, or Firm* — Cowan, Liebowitz & Latman, P.C.

(57) ABSTRACT

There is provided a distance detecting apparatus. An acquisition unit acquires a first image captured from a first point of view and a second image captured from a second point of view that is different from the first point of view A selection unit configured to select a representative pixel from the first image, based on a color of an object. A detection unit configured to detect a position in the second image corresponding to the representative pixel and thereby to detect a distance to the object corresponding to the position of the representative pixel.

17 Claims, 18 Drawing Sheets

(51) Int. Cl.
    *G02B 7/34*     (2021.01)
    *H04N 5/232*     (2006.01)
    *H04N 5/369*     (2011.01)
    *G06T 7/32*     (2017.01)
    *H04N 5/357*     (2011.01)
    *G06T 7/593*     (2017.01)
    *H01L 27/146*     (2006.01)
    *G03B 13/36*     (2021.01)

(52) U.S. Cl.
    CPC ............... *G06T 2207/10024* (2013.01); *H01L 27/14621* (2013.01); *H01L 27/14623* (2013.01); *H01L 27/14627* (2013.01)

(56) References Cited

U.S. PATENT DOCUMENTS

| | | | | |
|---|---|---|---|---|
| 2013/0148882 | A1* | 6/2013 | Lee | G06K 9/4652 |
| | | | | 382/164 |
| 2013/0308018 | A1* | 11/2013 | Sasaki | H04N 9/045 |
| | | | | 348/242 |
| 2017/0132769 | A1* | 5/2017 | Barron | G06K 9/6215 |
| 2017/0371162 | A1* | 12/2017 | Makino | G02B 27/0172 |

FOREIGN PATENT DOCUMENTS

| | | | | |
|---|---|---|---|---|
| JP | 2011007882 A | * | 1/2011 | |
| WO | 2013/073167 A1 | | 5/2013 | |
| WO | WO-2014006514 A2 | * | 1/2014 | ............... G06T 7/30 |

\* cited by examiner

FIG. 1A
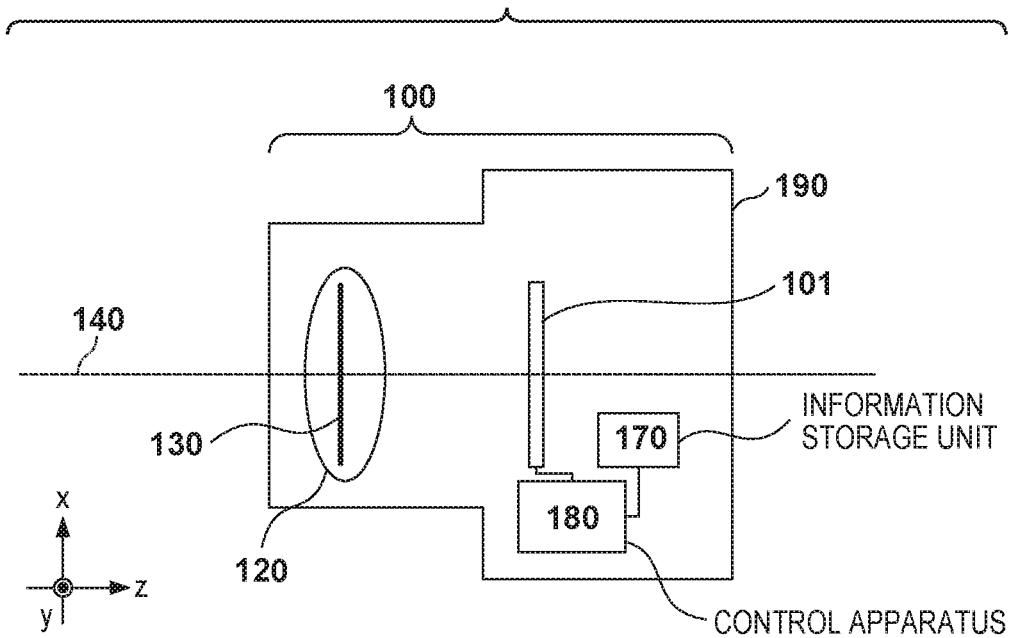
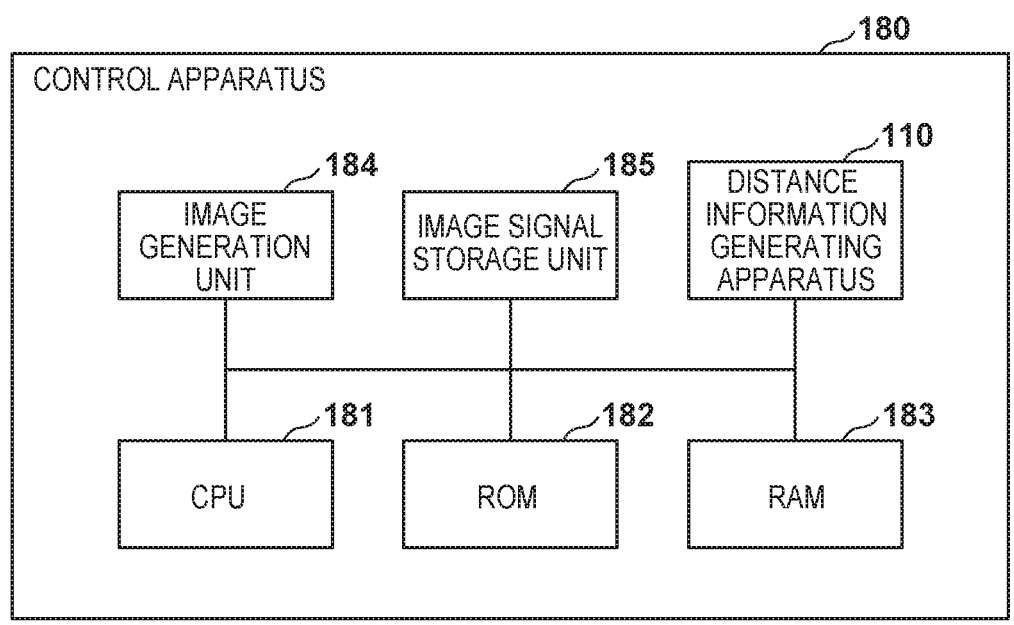

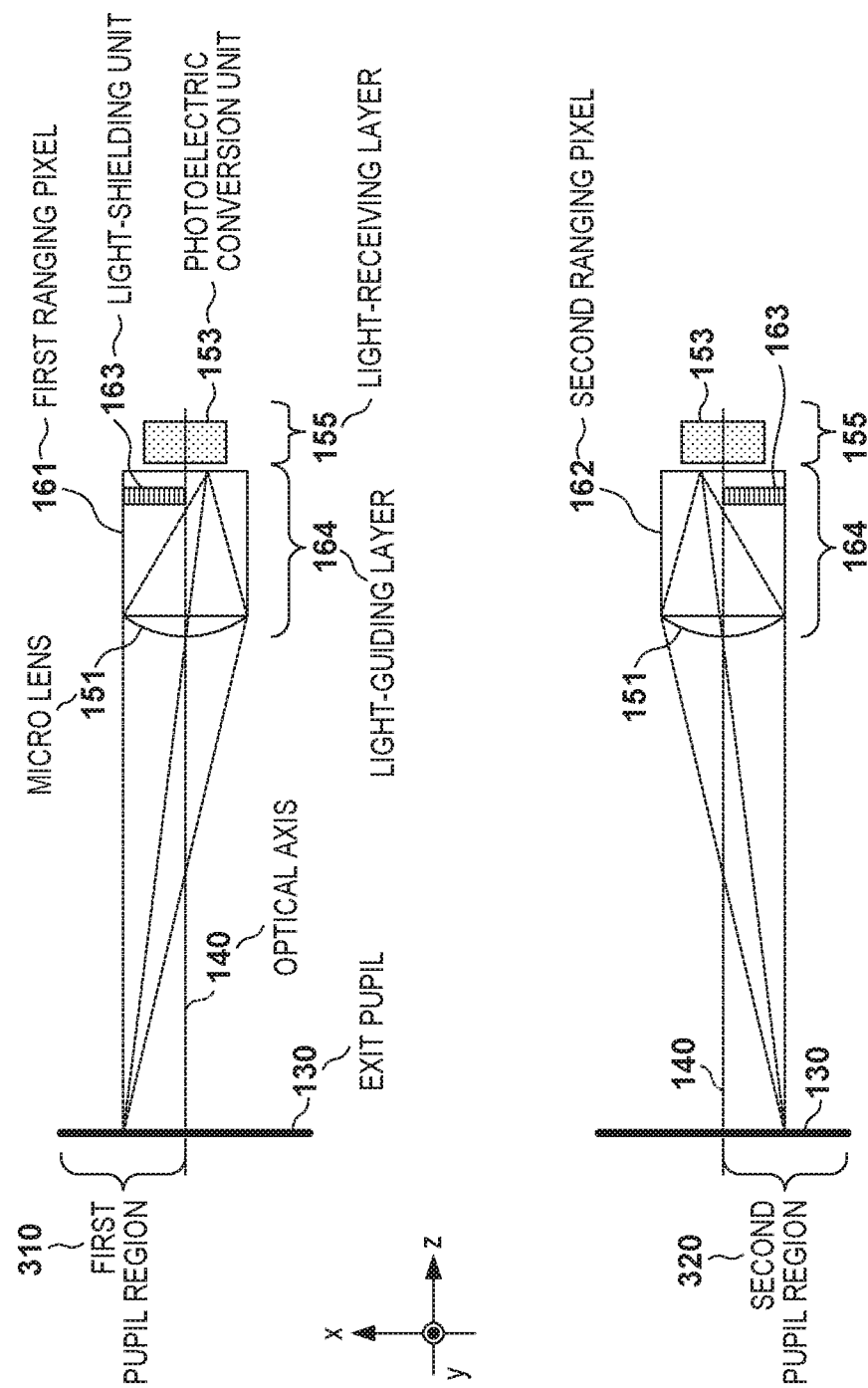

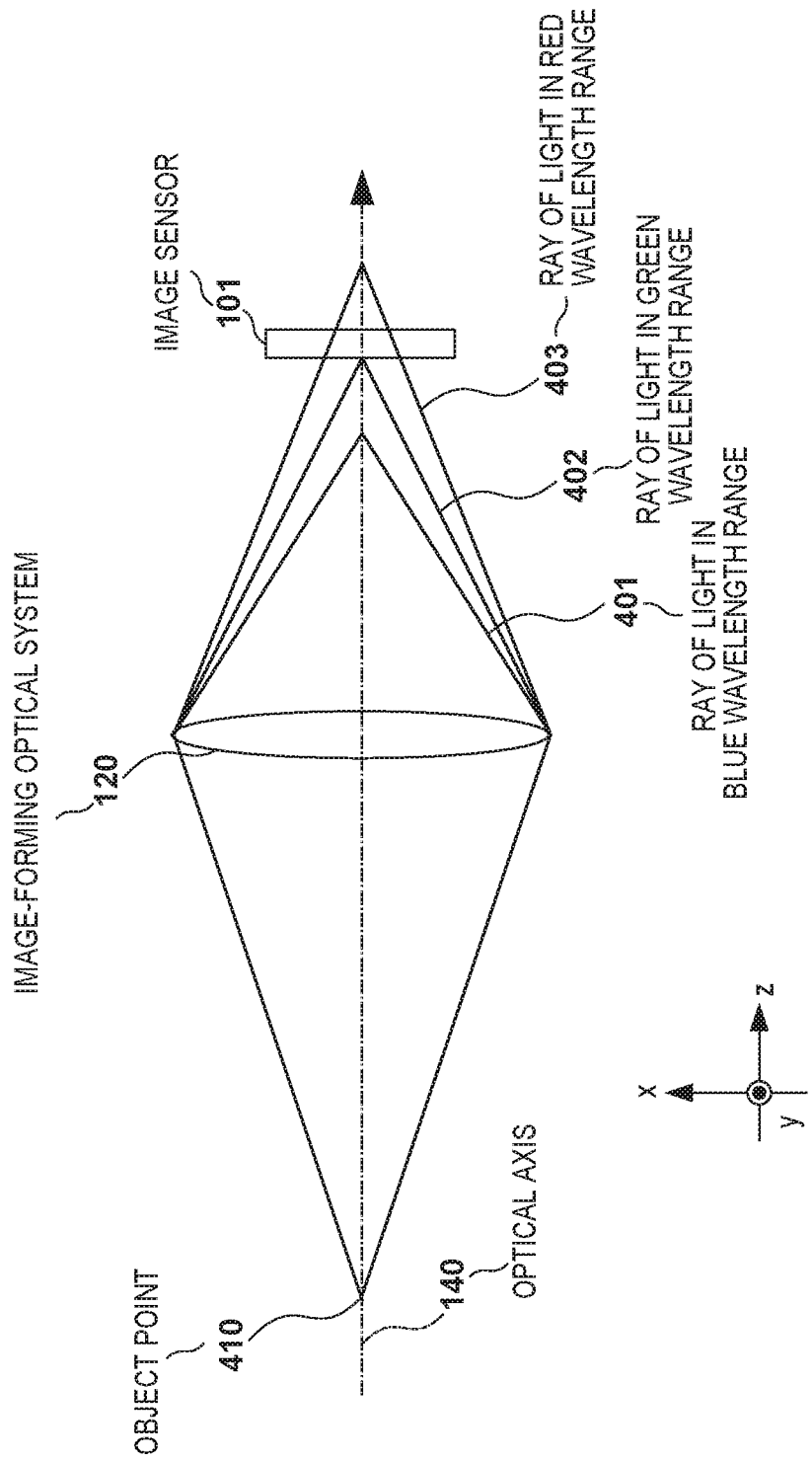

DISTANCE DETECTING APPARATUS, IMAGE CAPTURING APPARATUS, DISTANCE DETECTING METHOD, AND STORAGE MEDIUM

BACKGROUND OF THE INVENTION

Field of the Invention

The present invention relates to a distance detecting apparatus, an image capturing apparatus, a distance detecting method, and a storage medium.

Description of the Related Art

For image capturing apparatuses, such as a digital still camera and a digital video camera, which have a function to acquire an image signal for viewing, it has been proposed to add a ranging function to acquire the distance from the image capturing apparatus to an object (hereinafter called "object distance") at a plurality of pixel positions.

For example, Japanese Patent Laid-Open No. 2003-269917 discloses a stereo image capturing apparatus which has two image capturing apparatuses arranged side by side and which is configured to detect an object distance by the phase difference method. In the stereo image capturing apparatus disclosed in Japanese Patent Laid-Open No. 2003-269917, the amount of relative displacement (i.e., the amount of parallax) between the positions indicated by image signals sent from the two image capturing apparatuses is detected by cross-correlation operations and converted to an object distance by a predetermined conversion factor.

Japanese Patent Laid-Open No. 2011-007882 discloses a solid-state image sensor which imparts a ranging function to all or some of the pixels in the image sensor and which detects an object distance by the phase difference method. The ranging method disclosed in Japanese Patent Laid-Open No. 2011-007882 measures the distance on the image plane by the phase difference method, thus being called image plane phase difference ranging method. The image plane phase difference ranging method can provide two image signals, based on images generated by rays of light separately passing through different pupil regions in an image-forming optical system of the image capturing apparatus. This method can acquire an object distance by detecting the amount of parallax between the two image signals in a manner similar to the method for detecting the amount of parallax in the stereo image capturing apparatus, and then by converting the amount of parallax to the amount of defocus by a predetermined conversion factor. Further, the image plane phase difference ranging method can generate an image signal for viewing by synthesizing the two image signals.

These conventional ranging methods require multiple cross-correlation operations for each pixel and thus requires numerous operations. To reduce the number of operations, International Publication No. 2013/073167 discloses segmentation of image signals, and proposes to divide the image signals into a plurality of segments based on the similarity in their pixel values and to calculate the amount of parallax for each segment.

All of these ranging methods convert the amount of parallax to the object distance, using an optical coefficient such as the focal length of the image-forming optical system in the image capturing apparatus.

Each of the above-described image capturing apparatuses utilizes the image-forming optical system to form an image of an object on the image sensor. In this case, the image-forming optical system has chromatic aberration, which may cause an error in the detected object distance, depending on the color of the object. For example, if a blue object and a red object are present at the same distance, the image of the blue object is formed at a position corresponding to the blue wavelengths, and the image of the red object is formed at a position corresponding to the red wavelengths. Based on the amount of chromatic aberration, the conventional image capturing apparatuses tend to judge that these two objects are present at different distances. A process for correcting chromatic aberration in the image-forming optical system is proposed in Japanese Patent Laid-Open No. 2011-007882. According to this process, image signals are produced by image capturing pixels having different spectral sensitivity characteristics from each other (e.g., blue pixels, green pixels, and red pixels), and a ratio of signal values produced by the image capturing pixels having different spectral sensitivity characteristics is employed to correct chromatic aberration in the image-forming optical system. Although the correction process disclosed in Japanese Patent Laid-Open No. 2011-007882 can correct the influence of chromatic aberration, it is still difficult, even with use of the signal values produced by the pixels having spectral sensitivity characteristics, to acquire a correct wavelength distribution of an object, leaving a possibility of a residual correction error.

The amount of chromatic aberration varies according to the wavelength of light, namely, the color of the object. Accordingly, the color of the object affects an error in the detected object distance due to chromatic aberration. Nevertheless, no technology has relied on the color of the object in selecting target pixels (representative pixels) from which the amount of parallax is detected. For example, International Publication No. 2013/073167 selects representative pixels by SIFT, SURF, etc., without relying on the color of the object.

SUMMARY OF THE INVENTION

In light of such circumstances, the present invention is achieved to provide a technique for selecting a target pixel (representative pixel) from which the amount of parallax is detected, based on the color of the object.

According to a first aspect of the present invention, there is provided a distance detecting apparatus comprising one or more processors and a memory storing a program which, when executed by the one or more processors, causes the distance detecting apparatus to function as: an acquisition unit configured to acquire a first image captured from a first point of view and a second image captured from a second point of view that is different from the first point of view; a selection unit configured to select a representative pixel from the first image, based on a color of an object; and a detection unit configured to detect a position in the second image corresponding to the representative pixel and thereby to detect a distance to the object corresponding to the position of the representative pixel.

According to a second aspect of the present invention, there is provided a distance detecting method executed by a distance detecting apparatus, comprising: acquiring a first image captured from a first point of view and a second image captured from a second point of view that is different from the first point of view; selecting a representative pixel from the first image, based on a color of an object; and detecting a position in the second image corresponding to the representative pixel and thereby detecting a distance to the object corresponding to the position of the representative pixel.

According to a third aspect of the present invention, there is provided a non-transitory computer-readable storage medium which stores a program for causing a computer to execute a distance detecting method comprising: acquiring a first image captured from a first point of view and a second image captured from a second point of view that is different from the first point of view; selecting a representative pixel from the first image, based on a color of an object; and detecting a position in the second image corresponding to the representative pixel and thereby detecting a distance to the object corresponding to the position of the representative pixel.

Further features of the present invention will become apparent from the following description of exemplary embodiments with reference to the attached drawings.

BRIEF DESCRIPTION OF THE DRAWINGS

FIG. 1A shows the configuration of a digital camera 100.

FIG. 3A is a drawing for describing ray of lights received by a first ranging pixel 161 and a second ranging pixel 162.

FIG. 4 is a schematic view for describing axial chromatic aberration in an image-forming optical system 120.

DESCRIPTION OF THE EMBODIMENTS

Figure 1B:
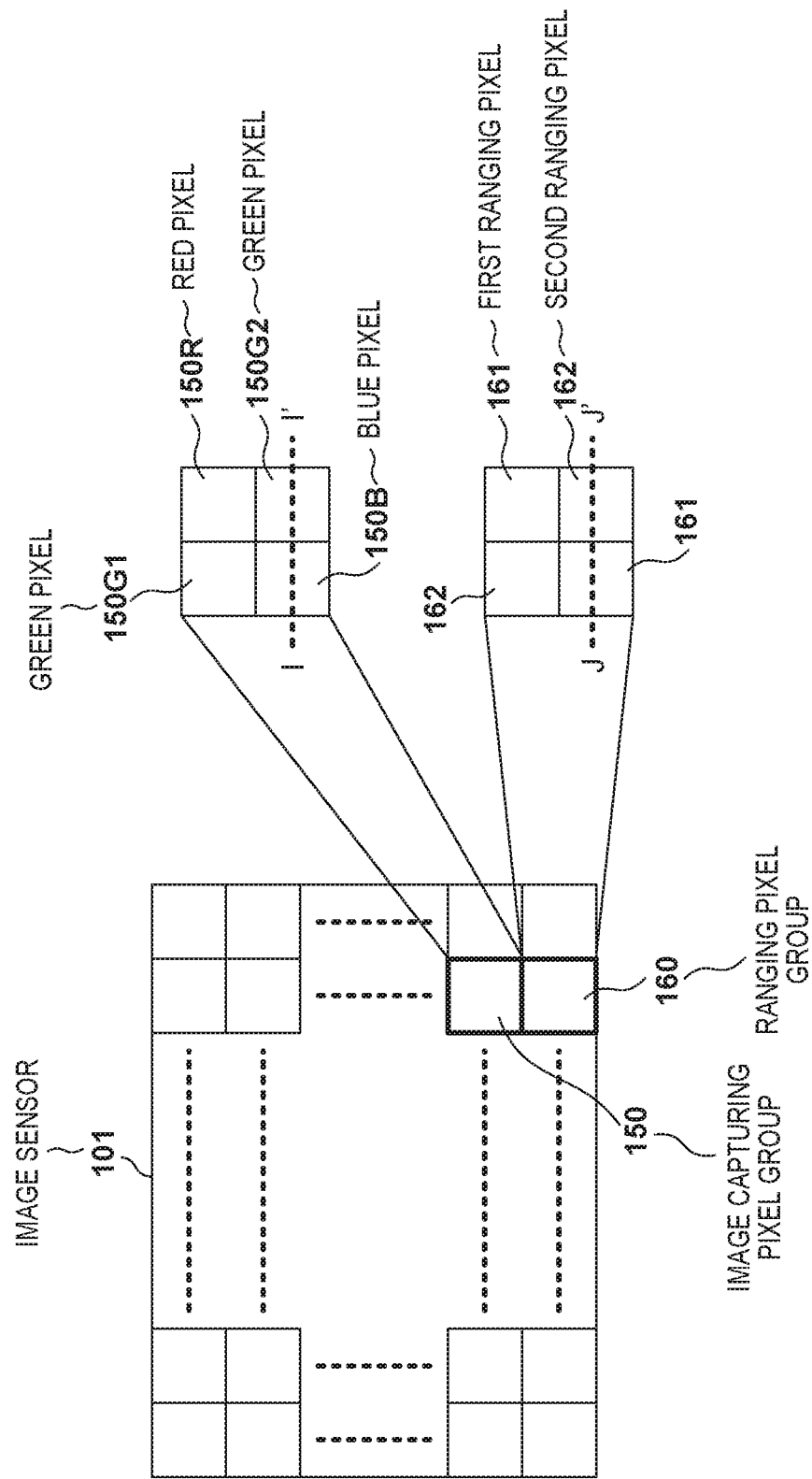
FIG. 1B is a sectional view of an image sensor 101, taken along the x-y plane in FIG. 1A.

Hereinafter, embodiments of the present invention will be described with reference to the attached drawings. It should be noted that the technical scope of the present invention is defined by the claims, and is not limited by the following respective embodiments. Also, not all of the combinations of the aspects that are described in the embodiments are necessarily essential to the present invention. Also, the aspects that are described in the respective embodiments can be combined as appropriate.

First Embodiment

<Configuration of the Digital Camera 100>

FIG. 1A shows the configuration of a digital camera 100, which is an example of the distance detecting apparatus. The distance detecting apparatus in the present embodiment should not be limited to a digital camera, and may be an electronic apparatus of a different type such as a personal computer.

The digital camera 100 has a camera housing 190. The camera housing 190 accommodates an image sensor 101, an image-forming optical system 120, an information storage unit 170, and a control apparatus 180. The control apparatus 180 is provided with a distance information generating apparatus 110, a CPU 181, a ROM 182, a RAM 183, an image generation unit 184, and an image signal storage unit 185. The distance information generating apparatus 110 can be implemented by a logic circuit, or can be implemented by the CPU 181, the ROM 182, and the RAM 183. In the latter case, a program stored in the ROM 182 is decompressed and executed in the RAM 183 by the CPU 181 to perform the function of the distance information generating apparatus 110. The image generation unit 184 can be implemented in the same manner.

The image-forming optical system 120 includes an image-taking lens of the digital camera 100 and functions to form an object image on the image sensor 101. The image-forming optical system 120 typically has a plurality of lenses, but only one lens is shown herein for simplicity. The image-forming optical system 120 has an exit pupil 130 provided at a predetermined distance from the image sensor 101. In the following description, the z-axis is an axis parallel to an optical axis 140 of the image-forming optical system 120. The x-axis and the y-axis are perpendicular to each other, and also perpendicular to the optical axis 140.

<Configuration of the Image Sensor 101>

The image sensor 101 is composed of a CMOS (complementary metal-oxide semiconductor), a CCD (charge coupled device) or the like, and has a ranging function by the image plane phase difference ranging method. When an object image is formed on the image sensor 101 via the image-forming optical system 120, the image sensor 101 photoelectrically converts the object image and generates an image signal based on the object image. The image generation unit 184 acquires the image signal, applies development processing, and generates an image signal for viewing. The image signal storage unit 185 can store the generated image signal for viewing. Referring next to FIGS. 1B and 2A-2J, the image sensor 101 in the present embodiment is described in greater detail.

FIG. 1B is a sectional view of an image sensor 101, taken along the x-y plane in FIG. 1A. The image sensor 101 is composed of an array of image capturing pixel groups 150 each having a two-by-two pixel arrangement and a plurality of ranging pixel groups 160 each having a two-by-two pixel arrangement.

Each image capturing pixel group 150 is composed of diagonally arranged green pixels 150G1 and 150G2 as well as a red pixel 150R and a blue pixel 150B as the other two pixels. The image capturing pixel group 150 produces a color image signal (a third image signal) carrying color information of the three colors: blue, green, and red. Having said that, the color information in the present embodiment is not limited to that of these three colors. For example, the color image signal may be a signal indicating a complementary color or may carry near-infrared information, etc. Although the following description refers only to the case of the three-color information of blue, green, and red, the description is similarly applicable if other color information is employed.

Each ranging pixel group 160 is composed of diagonally arranged first ranging pixels 161 as well as second ranging pixels 162 as the other two pixels. In each ranging pixel group 160, the first ranging pixels 161 and the second ranging pixels 162 produce first image signals and second image signals, respectively, as ranging image signals. In this embodiment, the pixels in the image capturing pixel groups 150 and those in the ranging pixel groups 160 are different pixels from each other. Instead, a color filter may be placed on each pixel in the ranging pixel groups 160, so that the resulting image signal can serve as both a color image signal and a ranging image signal.

Figure 2A:
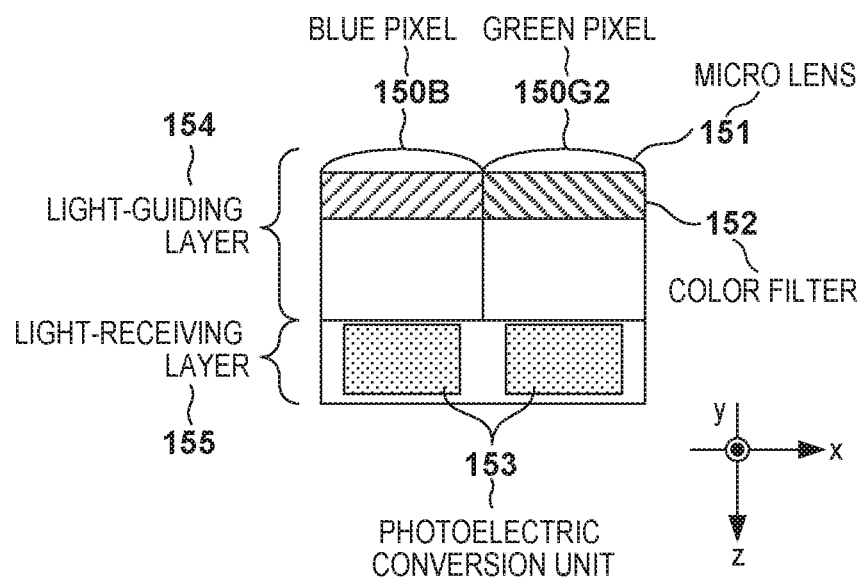
FIG. 2A is a schematic sectional view of an image capturing pixel group 150, taken along the line I-I' in FIG. 1B.
Figure 2B:
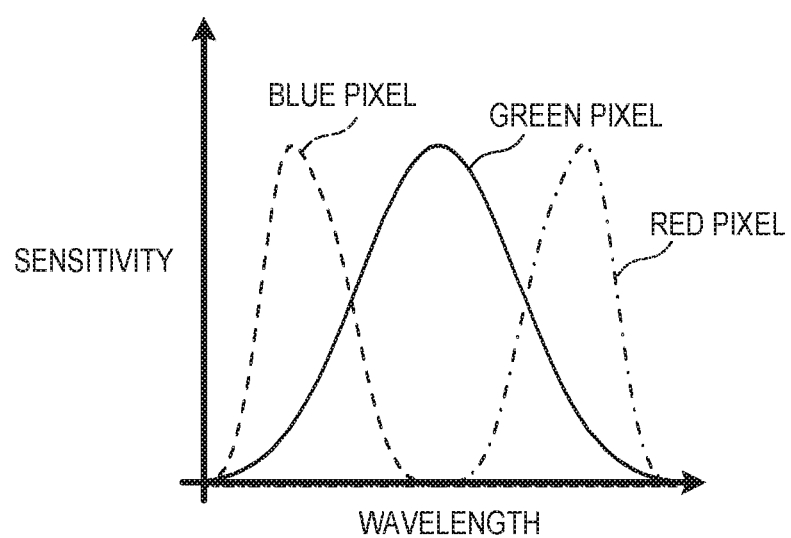
FIG. 2B is a graph showing the spectral sensitivities of the image capturing pixel group 150.

FIG. 2A is a schematic sectional view of an image capturing pixel group 150, taken along the line I-I' in FIG. 1B. Each of the pixels has a light-guiding layer 154 and a light-receiving layer 155. The light-guiding layer 154 is equipped with a microlens 151 for efficiently guiding a ray of light incident on the pixel to a photoelectric conversion unit 153, a color filter 152 for passing light in a specific wavelength band, and wires (not shown) for image readout and for pixel drive, and the like. The color filters 152 include three color types: blue, green, and red. The blue pixel 150B, the green pixels 150G1 and 150G2, and the red pixel 150R have spectral sensitivity characteristics as shown in FIG. 2B. The light-receiving layer 155 is equipped with the photoelectric conversion unit 153 for photoelectrically converting received light.

Figure 2C:
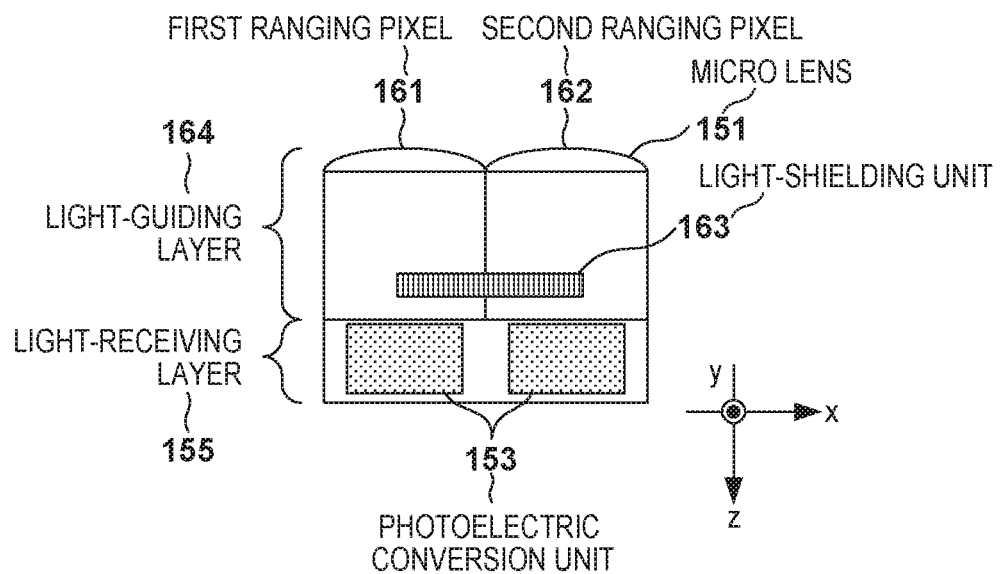
FIG. 2C is a schematic sectional view of a ranging pixel group 160, taken along the line J-J' in FIG. 1B.
Figure 2D:
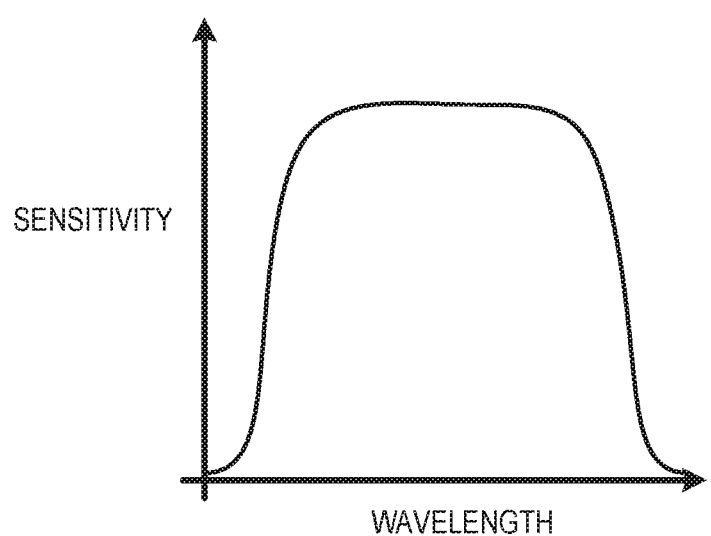
FIG. 2D is a graph showing the spectral sensitivity of the ranging pixel group 160.

FIG. 2C is a schematic sectional view of a ranging pixel group 160, taken along the line J-J' in FIG. 1B. Each of the pixels has a light-guiding layer 164 and a light-receiving layer 155. The light-receiving layer 155 is equipped with a photoelectric conversion unit 153. The light-guiding layer 164 is equipped with a microlens 151 for efficiently guiding a ray of light incident on the pixel to a photoelectric conversion unit 153, a light-shielding unit 163 for limiting light incident on the photoelectric conversion unit 153, and wires (not shown) for image readout and for pixel drive, and the like. In order to receive a greater amount of light, no color filter is placed on the ranging pixel group 160. Spectral sensitivities of the first ranging pixel 161 and the second ranging pixel 162 show such spectral sensitivity characteristics as obtained by multiplication of the spectral sensitivity of the photoelectric conversion unit 153 by the spectral sensitivity of an infrared cutoff filter. The spectral sensitivity of the first ranging pixel 161 and the second ranging pixel 162 is shown in FIG. 2D, which appears to be addition of the spectral sensitivities of the blue pixel 150B, the green pixel 150G1, and the red pixel 150R.

<Principles of Distance Measurement by the Image Plane Phase Difference Ranging Method>

The rays of light received by the first ranging pixel 161 and the second ranging pixel 162 in the image sensor 101 of the present embodiment are described with reference to FIG. 3A. FIG. 3A is a schematic diagram showing the exit pupil 130 in the image-forming optical system 120, as well as the first ranging pixel 161 and the second ranging pixel 162 in the image sensor 101. The microlens 151 shown in FIG. 3A is arranged such that the exit pupil 130 and the light-receiving layer 155 are optically conjugated. A ray of light passing through the exit pupil 130 in the image-forming optical system 120 is collected by the microlens 151 and guided to the photoelectric conversion unit 153, but partially blocked by the light-shielding unit 163 in the light-guiding layer 164. Eventually, as shown in FIG. 3A, the photoelectric conversion unit 153 provided in the first ranging pixel 161 mainly receives a ray of light passing through a first pupil region 310 in the exit pupil 130. Similarly, the photoelectric conversion unit 153 provided in the second ranging pixel 162 mainly receives a ray of light passing through a second pupil region 320 in the exit pupil 130.

The plurality of first ranging pixels 161 in the image sensor 101 mainly receive the rays of light passing through the first pupil region 310 and produce first image signals. Simultaneously, the plurality of second ranging pixels 162 in the image sensor 101 mainly receive the rays of light passing through the second pupil region 320 and produce second image signals. The first image signals can provide the intensity distribution of an image formed on the image sensor 101 by the rays of light passing through the first pupil region 310. The second image signals can provide the intensity distribution of an image formed on the image sensor 101 by the rays of light passing through the second pupil region 320.

Figure 3B:
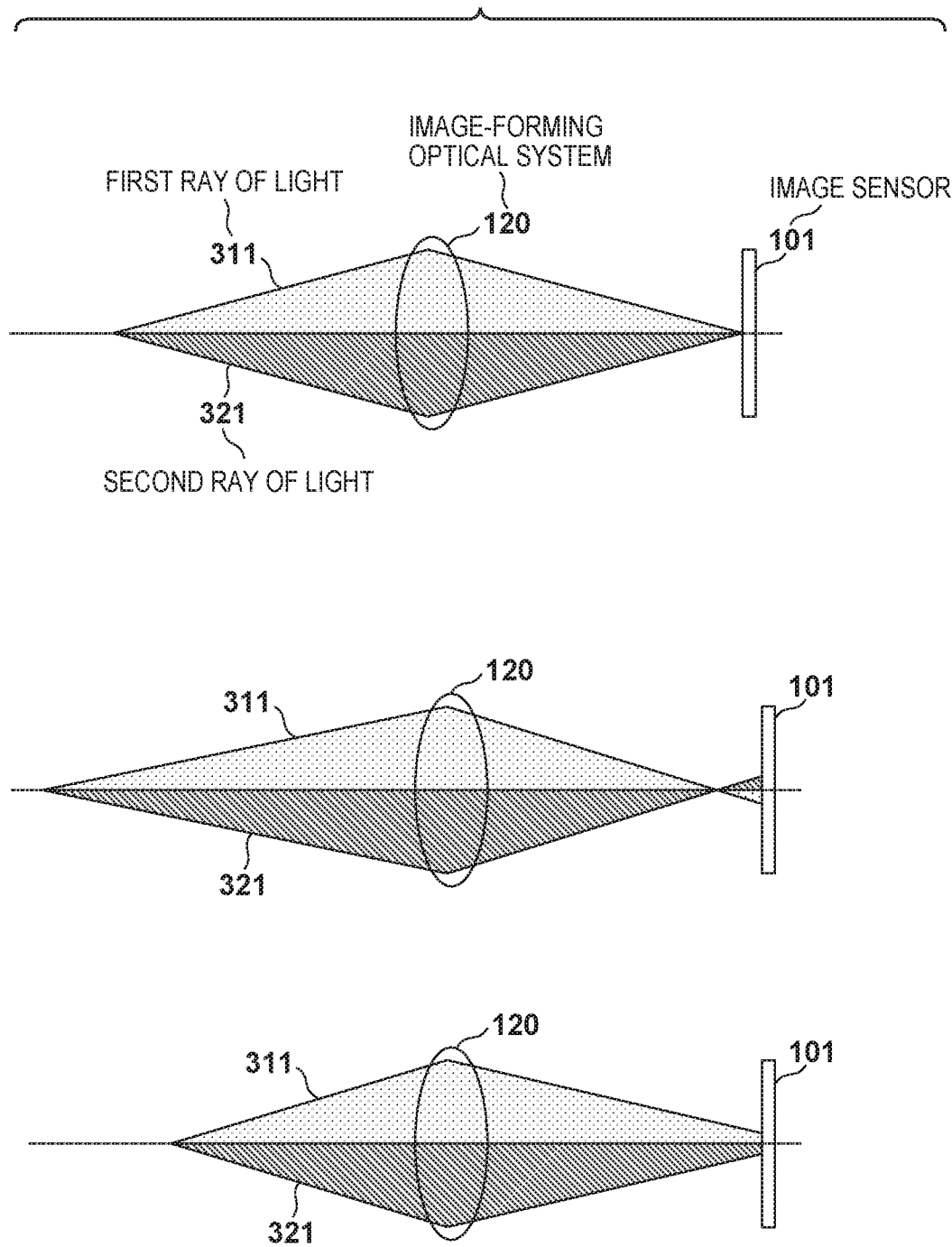
FIG. 3B is a drawing for describing the relationship between the amount of parallax and the amount of defocus.

The amount of relative displacement (i.e., the amount of parallax) between the position indicated by the first image signals and the position indicated by the second image signals is related to the amount of defocus. The relationship between the amount of parallax and the amount of defocus is described with reference to FIG. 3B. FIG. 3B schematically illustrates the states of the image sensor 101 and the image-forming optical system 120 in the present embodiment. In FIG. 3B, a first ray of light 311 represents the rays of light passing through the first pupil region 310, and a second ray of light 321 represents the rays of light passing through the second pupil region 320.

In the focused state shown at the top of FIG. 3B, the first ray of light 311 and the second ray of light 321 converge on the image sensor 101. In this state, the amount of parallax between the first image signal derived from the first ray of light 311 and the second image signal derived from the second ray of light 321 is 0. The middle of FIG. 3B shows a defocus state on the image side in a negative direction on the z-axis. In this state, the amount of parallax between the first image signal derived from the first ray of light 311 and the second image signal derived from the second ray of light 321 is a negative value, instead of 0. The bottom of FIG. 3B shows a defocus state on the image side in a positive direction on the z-axis. In this state, the amount of relative displacement between the first image signal derived from the first ray of light 311 and the second image signal derived from the second ray of light 321 is a positive value, instead of 0.

As understood from the comparison between the defocused states shown in the middle and at the bottom of FIG. 3B, the direction of displacement changes over according to whether the amount of defocus is positive or negative. It is also understood that the displacement corresponds to the amount of defocus and occurs according to the image-forming relationship (geometric relationship) of the image-forming optical system 120. The amount of parallax, which is a displacement between the position indicated by the first image signals and the position indicated by the second image signals, can be detected by a region-based matching method to be described later.

The image-forming optical system 120 has chromatic aberration. FIG. 4 is a schematic view for describing axial chromatic aberration in the image-forming optical system 120. FIG. 4 shows a ray of light 401 in the blue wavelength range, a ray of light 402 in the green wavelength range, and a ray of light 403 in the red wavelength range. As shown in FIG. 4, light originating from an object point 410 is collected by the image-forming optical system 120, and forms images at positions corresponding to the respective wavelengths. It is therefore necessary to correct axial chromatic aberration, in order to convert the detected amount of parallax to the amount of defocus or to a distance from the digital camera 100 to the object (object distance).

<Actions of the Distance Information Generating Apparatus 110>

Figure 5A:
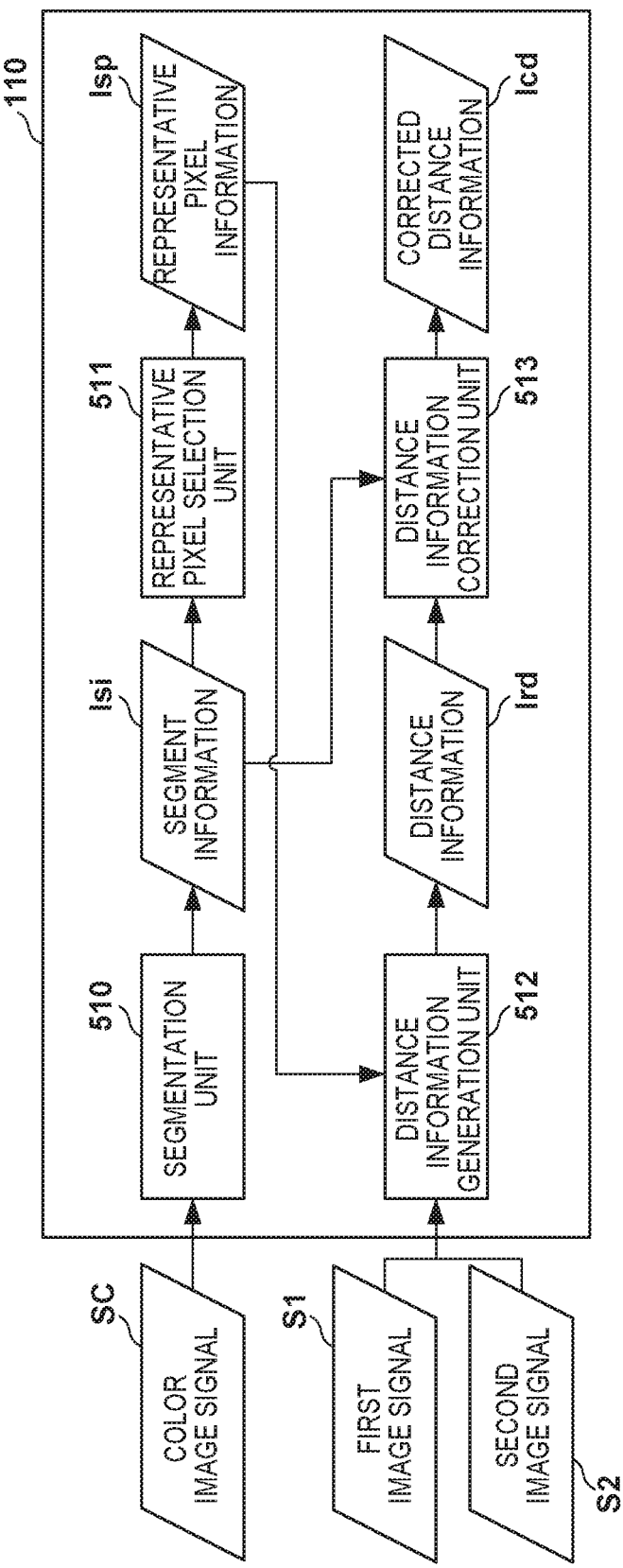
FIG. 5A is a block diagram which shows a schematic configuration of a distance information generating apparatus 110.
Figure 5B:
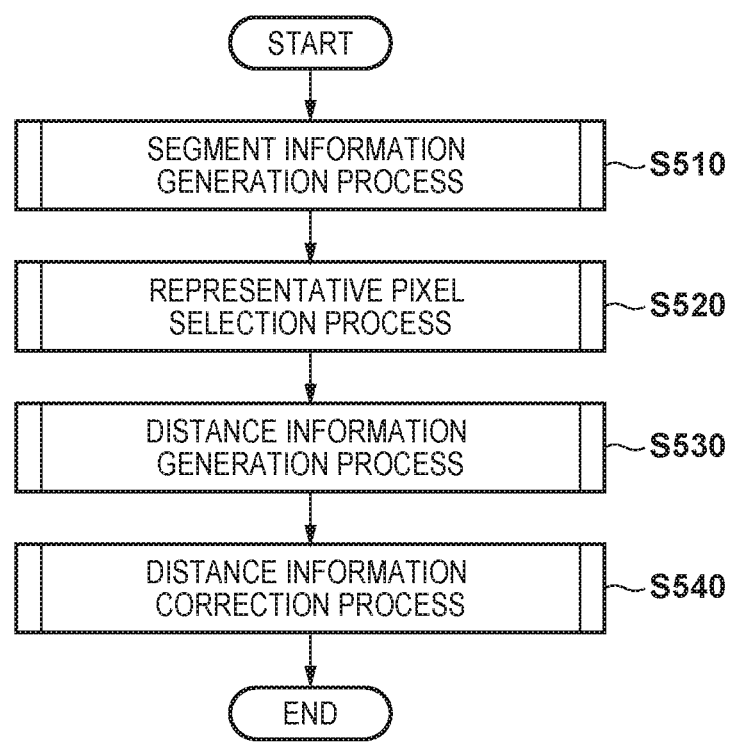
FIG. 5B is a flowchart which shows actions of the distance information generating apparatus 110.

Now, the description turns to the distance information generating apparatus 110 according to the present embodiment. FIG. 5A is a block diagram which shows a schematic configuration of the distance information generating apparatus 110. FIG. 5B is a flowchart which shows actions of the distance information generating apparatus 110.

In the distance information generating apparatus 110, a segmentation unit 510 generates segment information Isi. A representative pixel selection unit 511 selects a representative pixel from each segment and generates representative pixel information Isp. A distance information generation unit 512 generates distance information Ird according to the representative pixel information Isp. A distance information correction unit 513 corrects the distance information Ird using the segment information Isi, and thereby generates corrected distance information Icd.

The processes done by the segmentation unit 510, the representative pixel selection unit 511, the distance information generation unit 512, and the distance information correction unit 513 are described with reference to FIG. 5B.

Figure 6A:
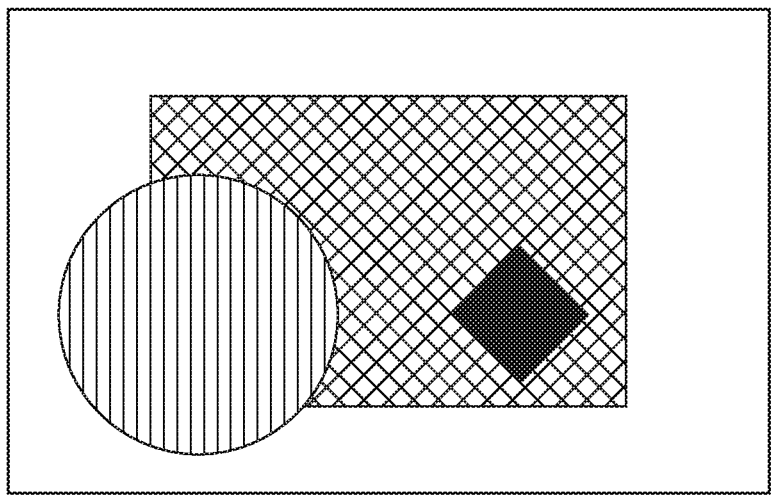
FIG. 6A shows a color image signal SC.

In step S510, the segmentation unit 510 acquires a color image signal SC from the image sensor 101 or the image signal storage unit 185, and generates segment information Isi. An exemplary segment information generation process in step S510 is described with reference to FIGS. 6A-6C. FIG. 6A shows a color image signal SC. The segmentation unit 510 compares color information of the pixels and classifies a plurality of neighboring pixels having similar color information as a set (hereinafter called "segment" or "superpixel").

Figure 6B:
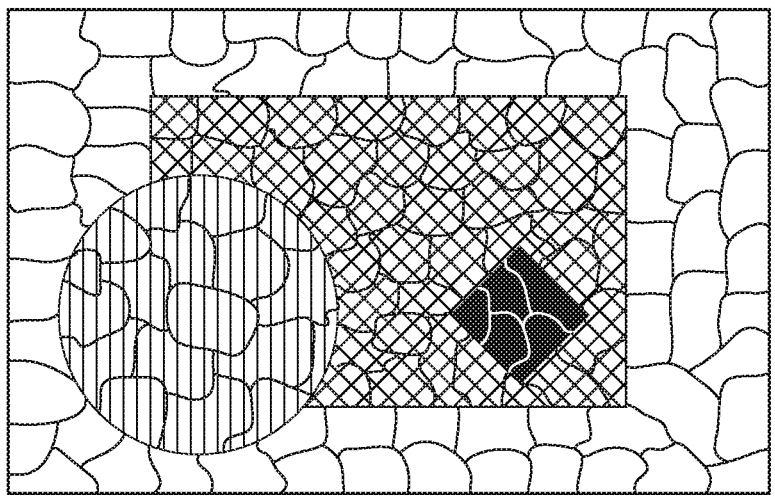
FIGS. 6B and 6C show the color image signals SC divided into a plurality of segments.
Figure 6C:
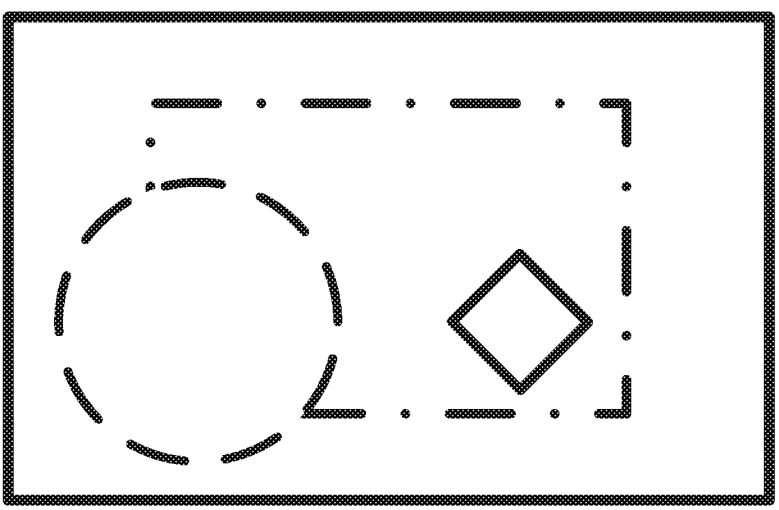

FIG. 6B shows the color image signal SC divided into a plurality of segments. The methods for such segmentation include a watershed algorithm and a superpixel segmentation algorithm. In FIG. 6B, each of the objects contains a plurality of segments. Instead, segments in each object may be integrated to generate a larger segment which conforms to the shape of the object. Generation of a greater segment advantageously reduces the number of operations in the later steps. In FIG. 6C, each object is represented by a single segment (the segments are distinguished from each other by line types). The large segments as shown in FIG. 6C can be generated by integration of smaller segments. Instead, the large segments as shown in FIG. 6C may be directly generated by a method that has been actively studied in the technical field of semantic segmentation. Not only the color information but also the shape information or other information may be employed to generate the segments. Known segmentation methods further include supervised segmentation. The segmentation methods are not limited to those mentioned herein, and any segmentation method that can select a set of pixels likely to indicate the same distance or a set of pixels likely to express the same object is also useful.

In step S520, the representative pixel selection unit 511 generates the representative pixel information Isp, using the color image signal SC and the segment information Isi. In this step, the representative pixel selection unit 511 selects a representative pixel suitable for generation of distance information (suitable for distance detection) from each of the plurality of segments which are indicated by the segment information Isi obtained in step S510. For distance detection, a cross-correlation operation is typically applied to a region (pixel region) including more than one pixel. Hence, the representative pixel selection unit 511 selects not only the representative pixel but also a neighboring pixel region. In the present embodiment, however, strict distinction between the "representative pixel" and the neighboring "pixel region" is not necessary, unless otherwise stated. For example, the configuration of selecting both the representative pixel and the pixel region as described in the present embodiment encompasses a configuration using an algorithm which selects only a pixel region without distinguishing between the representative pixel and the pixel region. In such a configuration, any of the pixels in the selected pixel region substantially serves as a representative pixel.

For example, the method for selecting the representative pixels can be selected from any of the following six methods or can be any combination thereof.

The first selection method is based on contrast. In a distance information generation process, details of which will be described later, the distance is calculated (detected) by cross-correlation operations of the first image signal S1 and the second image signal S2 at certain pixels and neighboring pixel regions thereof. However, in low-contrast regions, the result of correlation between the regions of incorrect parallax is not significantly different from the result of correlation between the regions of correct parallax. It is therefore desirable to calculate the distance in a high-contrast region. In the case where the color image signal SC has a high-contrast region, corresponding regions in the first image signal S1 and the second image signal S2 are assumed to have high contrast as well. Based on this assumption, the representative pixel selection unit 511 sets a potential pixel region in a segment of the color image signal SC and calculates a variance $\sigma$ of the pixel value in the potential pixel region. If the variance $\sigma$ is not less than a predetermined threshold value $T\sigma$ ($\sigma \geq T\sigma$), the representative pixel selection unit 511 determines that the potential pixel region is a high-contrast region, and selects a representative pixel from this region. Namely, the representative pixel selection unit 511 selects a representative pixel from a region where contrast is not less than the threshold value. Alternatively, the representative pixel selection unit 511 may judge a region showing a greater variance $\sigma$ as more suitable for generation of the distance information. Further alternatively, the representative pixel selection unit 511 may compare the contrast among a plurality of pixel regions in a segment, and then may select a representative pixel from the highest-contrast region or may select a representative pixel, one each, from a predetermined number of regions in order from the highest-contrast region to the lowest-contrast region. The high-contrast region can be selected in any manner.

The second selection method concerns a repeating pattern. If a repeating pattern appears in the direction of parallax (the x-axis direction in the present embodiment), the result of correlation is likely to be high between the regions of incorrect parallax. It is therefore desirable to select a representative pixel from a region which is not a repeating pattern. Presence of a repeating pattern is judged by whether a similar pixel pattern is present in the neighborhood of a potential pixel region (for example, whether a similar pixel pattern is present around the potential pixel region, within the range of the assumed maximum amount of parallax). The representative pixel selection unit 511 obtains correlation values between the potential pixel region in the color image signal SC and different pixel regions of the same size within the range of the maximum amount of parallax. If any of the different pixel regions shows a high correlation, the representative pixel selection unit 511 recognizes the presence of a repeating pattern. Presence of a repeating pattern may be also recognized by detection of periodicity by Fourier transform or the like. Alternatively, the representative pixel selection unit 511 may set a threshold value and calculate a binary evaluation value just as in the case of detecting a high-contrast region, or the representative pixel selection unit 511 may express the degree of repeating pattern by a continuous value. As a further alternative, the representative pixel selection unit 511 may rank a plurality of pixel regions according to the degree of repeating pattern such that a pixel region less likely to be a repeating pattern is ranked higher, and may select a representative pixel, one each, from a predetermined number of regions in order from the highest-ranked region to the lowest-ranked region. The repeating pattern can be detected in any manner.

The third selection method concerns a segment boundary. As shown in FIGS. 6B and 6C, the segmentation in the present embodiment is performed such that a boundary of at least one of the plurality of segments contains a boundary of the colors of the object. As a result, the neighborhood of the segment boundary is likely to be the neighborhood of the boundary of the distance information. In this case, the first image signal S1 and the second image signal S2 may not be able to provide corresponding regions (i.e., highly correlated regions). This is because parallax prevents each one of these image signals from covering a certain region of an object (occluded region) which is only detectable by the other one of the image signals. In view of this situation, the representative pixel selection unit 511 selects a representative pixel (and a neighboring pixel region thereof) from regions which are not in the neighborhood of the segment boundary. In other words, the representative pixel selection unit 511 does not select a representative pixel from the neighborhood of the segment boundary. To give an example of specific criteria, the representative pixel selection unit 511 selects a representative pixel such that all pixel regions in the neighborhood of the representative pixel are contained in the same segment. Alternatively, the representative pixel selection unit 511 may select a representative pixel such that the distance (pixel count) from the segment boundary to the representative pixel is not less than a predetermined distance. Further alternatively, just as in the case of the detection of a repeating pattern, the representative pixel selection unit 511 may evaluate the distance from the segment boundary by setting a threshold value and making a binary evaluation or by relying on a continuous value such as the degree of segment boundary or the like.

The fourth selection method concerns chroma. The representative pixel selection unit 511 selects a representative pixel from a near-achromatic region, using the information of the color image signal SC. Such selection can reduce the influence of chromatic aberration. In a distance information correction process concerning chromatic aberration, details of which will be described later, the distance information is corrected by contrast variation information of the colors respectively passing through the blue, green, and red color filters. For example, if a representative pixel is selected from a pixel region represented by red only, the representative pixel and the neighboring pixel region carry little information of blue and green. However, even the simple information of red covers a wide wavelength range as shown in FIG. 2B, and causes a greater error in identifying the main wavelength component in the information. It is therefore desirable to select a representative pixel from a near-achromatic region, i.e., a region which generally possesses sufficient information of each color. This requirement is also applicable if the color filters have other colors than blue, green, or red. To give an example, the representative pixel selection unit 511 converts RGB information to an isochromatic color space such as the Lab color space. In this case, a color having a smaller chroma $C(\sqrt{(a^2+b^2)}$ in the Lab color space) is closer to an achromatic color. Hence, the representative pixel selection unit 511 selects a representative pixel, for example, such that the chroma of the corresponding object is not greater than a threshold value. The chroma C may be used in evaluation of the threshold value, the continuous value, and the ranking. For example, the representative pixel selection unit 511 can select a pixel region in which the average value of the chroma C is minimum in the segment. Such selection reduces an error in the correction process and improves the accuracy of the corrected distance information Icd to be described later.

The fifth selection method concerns color identity. In the distance information correction process concerning chromatic aberration, if representative pixels and pixel regions having a substantially identical color can be selected in many segments, the same amount of correction is applicable to these segments. This arrangement can reduce the number of operations in the distance information correction process. A method for distinguishing color identity may be to determine a reference color and evaluate each color by a color difference from the reference color. To give an example, the representative pixel selection unit 511 converts RGB information to the Lab color space. If the reference color is L', a', b', the color difference E is represented by $\sqrt{((L-L')^2+(a-a')^2+(b-b')^2)}$. A smaller color difference E means closer similarity to the reference color. With use of this value, the similarity of the pixels in each segment to the reference color can be evaluated by a binary, a continuous value, ranking, or the like. For example, the representative pixel selection unit 511 selects two representative pixels such that the difference in object color at the positions corresponding to the two representative pixels is not greater than a threshold value. Another exemplary method is to convert RGB values of all pixels to the Lab color space, to perform clustering using Lab values and classify the pixels having similar Lab values into clusters, and to apply the same amount of correction to the distance information in the same cluster. The clustering method may be K-means clustering or any other method.

The sixth selection method concerns chromatic aberration in the optical system. In the field of optical design, the optical system can be designed to reduce chromatic aberration in a certain wavelength range. For example, in an optical system which can reduce chromatic aberration in a wavelength range from green to red, the representative pixel selection unit 511 selects representative pixels and pixel regions whose RGB information of the object is in the range from green to red. Specific selection methods include, for example, conversion to the Lab color space as described above, and may be selected without limitation. For example, in the optical system employed to capture the first image signal S1 and the second image signal S2, the representative pixel selection unit 511 can select a representative pixel such that the difference between a particular color with small chromatic aberration and the color of the object corresponding to the position of the representative pixel is not greater than a threshold value. The representative pixel selection unit 511 can acquire information of the particular color from the information storage unit 170. Although the representative pixel is selected from a wide wavelength range, an error due to chromatic aberration is so small that an error can be reduced further by the subsequent correction process. Considering that an error due to chromatic aberration is small, the correction process may be even omitted. According to this selection method, it is possible to reduce the number of operations while keeping the accuracy of the distance information. In the above description, the green-to-red wavelength range is mentioned merely as an example and should not limit the design of the optical system. If an intended use is already decided, it is desirable to design the optical system in accordance with the intended use. For an existing optical system, if the amount of chromatic aberration is known, it is similarly possible to set the wavelength range from which a representative pixel is selected.

The representative pixel selection unit 511 may select more than representative pixel from each segment. For example, in the case where a plurality of pixels in a segment satisfy the conditions of the adopted selection method (e.g., one of the six selection methods described above), the representative pixel selection unit 511 selects these pixels as representative pixels. Alternatively, the representative pixel selection unit 511 may set a threshold value to each of such conditions, and may select one or more representative pixels which "satisfy all conditions", which "satisfy some of the conditions", or which are otherwise appropriate. Alternatively, the representative pixel selection unit 511 may add weight to each condition, and may select one or more representative pixels based on a total threshold value of all conditions. Alternatively, the representative pixel selection unit 511 may select a single representative pixel which is the best match to the conditions. Alternatively, if none of the pixels in a segment satisfies the conditions, the representative pixel selection unit 511 may not select any representative pixel, based on the judgment that no reliable distance information is available from this segment. In this case, no distance information is generated in this segment. The conditions for selecting the representative pixel may be changed or added, depending on the scene or the purpose. If more than one representative pixel is selected in a segment, the distance information correction unit 513 integrates the distance information from the plurality of representative pixels in the segment after the distance information is corrected. The integration process will be detailed later.

In the present embodiment, the segment information generation process in step S510 may be omitted. If the segment information generation process is omitted, the representative pixel selection unit 511 selects representative pixels from the color image signal SC, not from the segments in the color image signal SC. Also in this case, the above-mentioned six selection methods are similarly applicable just as in the case where segmentation is applied, except the conditions involving the relationship between segments. For example, based on the fourth selection method (the chroma-based selection method), the representative pixel selection unit 511 may select one or more representative pixels in the color image signal SC, from a near-achromatic region.

Next in step S530, the distance information generation unit 512 generates distance information. The distance information generation unit 512 acquires the first image signal S1 and the second image signal S2 from the image sensor 101 or the image signal storage unit 185. Then, according to the representative pixel information Isp generated in step S520, the distance information generation unit 512 generates distance information Ird which represents an object distance. In the following description, the distance information generation unit 512 generates the amount of defocus as the distance information Ird.

Figure 7:
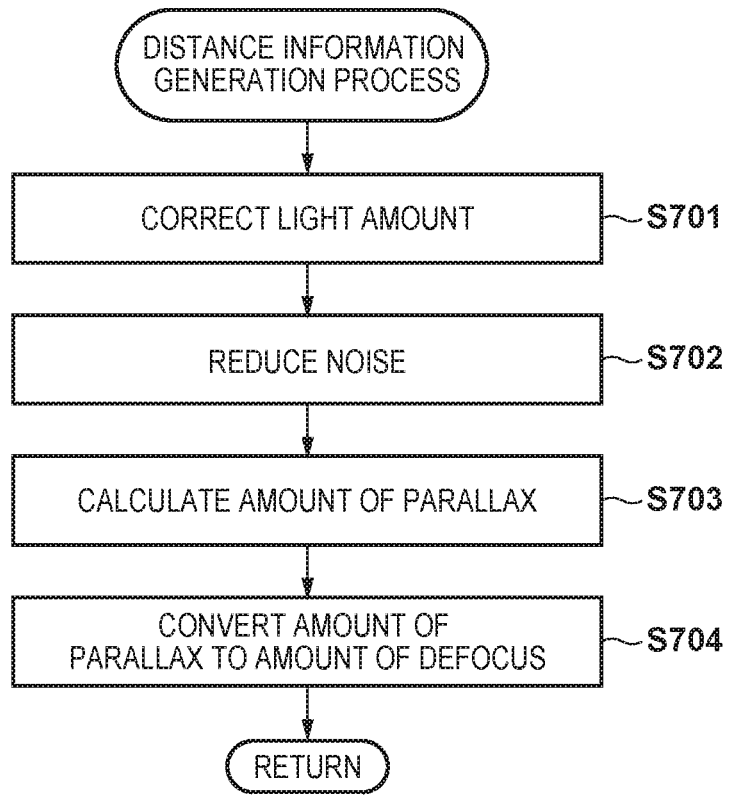
FIG. 7 is a flowchart which shows a distance information generation process in detail.

The distance information generation process is now described in detail, with reference to FIG. 7. The following process is applied only to a relevant pixel region, according to the representative pixel information Isp. Depending on the situation, however, the distance information generation process may be applied to all pixels.

In step S701, the distance information generation unit 512 corrects the amount of light in the first image signal S1 and the second image signal S2. At the edge of the angle of view in the image-forming optical system 120, the shape of the first pupil region 310 and that of the second pupil region 320 are not identical due to vignetting, which disturbs the balance of the amount of light between the first image signal S1 and the second image signal S2. To correct re amount of light in the first image signal S1 and the second image signal S2 in step S701, the distance information generation unit 512 uses a light amount correction value stored in the information storage unit 170. In this regard, the light amount correction value may not necessarily be the one stored in the information storage unit 170. For example, the distance information generation unit 512 may generate a light amount correction value from the area ratio of the first pupil region 310 to the second pupil region 320, and may use this light amount correction value to correct the amount of light.

In step S702, the distance information generation unit 512 reduces noise applied by the image sensor 101. Specifically, the distance information generation unit 512 processes the first image signal S1 and the second image signal S2 by filtering with use of a band-pass filter. Generally speaking, the high-frequency region having a higher spatial frequency shows a lower signal-to-noise ratio (the ratio of the signal component to the noise component), with a relatively increasing proportion of the noise component. In this case, a low-pass filter which allows a higher frequency to pass at a lower transmittance can be employed. The light amount correction in step S701 may not always achieve a design value, due to a manufacturing error in the image-forming optical system 120 or some other causes. Hence, in step S702, it is desirable to use a band-pass filter through which the DC component (the component whose spatial frequency is 0) passes at a transmittance of 0 and the high-frequency component passes at a low transmittance.

In step S703, the distance information generation unit 512 calculates (detects) the amount of parallax between the first image signal S1 and the second image signal S2. Specifically, the distance information generation unit 512 sets a keypoint in the first image signal S1 corresponding to the representative pixel indicated by the representative pixel information Isp, and sets a matching region centered on the keypoint. Thus, the above-described representative pixel selection process in which the representative pixel selection unit 511 selects one or more representative pixels from the color image signal SC substantially serves to select one or more representative pixels from the first image signal S1. The matching region corresponds to the pixel region selected by the representative pixel selection unit 511, and is defined, for example, by a rectangle centered on the keypoint and having a certain number of pixels along each side. The shape of the matching region may be arranged in accordance with the shape of a segment. Next, the distance information generation unit 512 sets a reference point in the second image signal S2 and a reference region centered on the reference point. The reference region has the same size and shape as the matching region. While successively moving the reference point, the distance information generation unit 512 calculates the degree of correlation between the first image signal S1 in the matching region and the second image signal S2 in the reference region, and detects a reference point with the highest degree of correlation as a point corresponding to the keypoint. The relative displacement between the key point and the corresponding point represents the amount of parallax at the keypoint. By calculating the amount of parallax while successively changing the keypoint according to the representative pixel information Isp, the distance information generation unit 512 can calculate the amount of parallax at a plurality of pixel positions. The degree of correlation can be calculated by any known methods. For example, NCC (Normalized Cross-Correlation) which evaluates normalized cross-correlation between the image signals is applicable. Other applicable methods include SSD (Sum of Squared Difference) which evaluates the square sum of the difference between the image signals, and SAD (Sum of Absolute Difference) which evaluates the absolute sum of the difference between the image signals.

In step S704, the distance information generation unit 512 converts the amount of parallax to the amount of defocus, which is the distance from the image sensor 101 to the focal point in the image-forming optical system 120, using a predetermined conversion factor. The amount of parallax d can be converted to the amount of defocus $\Delta L$ by Formula (1) below, $$\Delta L = K \times d \tag{1}$$

wherein K represents the predetermined conversion factor, $\Delta L$ represents the amount of defocus, and d represents the amount of parallax.

The processes in steps S703 and S704 are performed for each of the plurality of representative pixels, so that the distance information generation unit 512 can generate the distance information Ird which contains, as the distance information, the amount of defocus at a plurality of pixel positions.

Turning next to step S540, the distance information correction unit 513 corrects the distance information. Namely, the distance information correction unit 513 corrects the distance information Ird and generates corrected distance information Icd. To correct the distance information Ird, the distance information correction unit 513 uses the segment information Isi generated by the segmentation unit 510 and the color image signal SC acquired from the image sensor 101 or the image signal storage unit 185.

Figure 8:
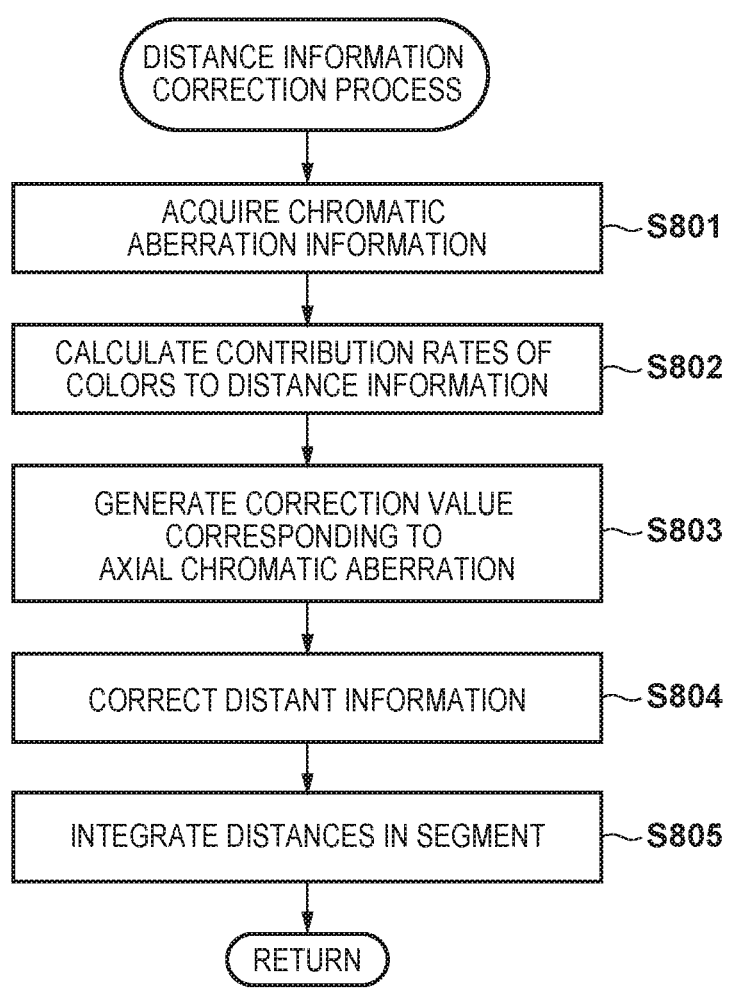
FIG. 8 is a flowchart which shows a distance information correction process in detail.

The distance information correction process is now described in detail, with reference to FIG. 8.

In step S801, the distance information correction unit 513 acquires chromatic aberration information from the information storage unit 170. Chromatic aberration information Ico stored in the information storage unit 170 includes chromatic aberration information Icob in the blue wavelength range, chromatic aberration information Icog in the green wavelength range, and chromatic aberration information Icor in the red wavelength range. The chromatic aberration information Icob in the blue wavelength range can be the amount of axial chromatic aberration subjected to weighted averaging by the spectral sensitivity characteristics of the blue pixel 150B (FIG. 2B). Similarly, the chromatic aberration information Icog in the green wavelength range and the chromatic aberration information Icor in the red wavelength range can be the amounts of axial chromatic aberration subjected to weighted averaging by the spectral sensitivity characteristics of the pixels in the respective wavelength ranges (the green pixel 150G1 for the green wavelength range, and the red pixel 150R for the red wavelength range). The amount of axial chromatic aberration in the image-forming optical system 120 may be a relative distance from the best focused point at a predetermined wavelength. The predetermined wavelength can be selected, for example, from the wavelength at which the luminosity factor is maximum or the wavelength at which the spectral sensitivity of the green pixel 150G1 is maximum.

From steps S802 to S804, the distance information correction unit 513 corrects an error in the distance information Ird due to chromatic aberration. To correct the distance information Ird, the distance information correction unit 513 uses the chromatic aberration information Ico and the color image signal SC acquired from the image sensor 101 or the image signal storage unit 185.

Specifically, in step S802, the distance information correction unit 513 calculates contribution rates of the respective wavelength ranges (the blue wavelength range, the green wavelength range, and the red wavelength range) which represent how much the respective wavelength ranges have contributed to the generation of the distance information Ird by the distance information generation unit 512. The color information including a greater contrast variation along the direction of parallax between the first image signal S1 and the second image signal S2 (along the x-direction) has a higher contribution rate. To evaluate the level of contrast variation, the distance information correction unit 513 extracts the image signal formed by the blue pixel 150B from the color image signal SC and generates a contrast variation level Cb. Similarly, the distance information correction unit 513 generates contrast variation levels Cg and Cr from the image signals formed by the green pixels 150G1 and 150G2 and the image signal formed by the red pixel 150R. The distance information correction unit 513 calculates the contribution rates of the respective color information by Formulas (2) below, using the contrast variation levels Ch, Cg, Cr for the corresponding color information.

Contribution rate of the blue wavelength range
$CTBb = Cb/(Cb+Cg+Cr)$

Contribution rate of the green wavelength range
$CTBg = Cg/(Cb+Cg+Cr)$ \hfill (2)

Contribution rate of the red wavelength range
$CTBr = Cr/(Cb+Cg+Cr)$

The process for generating the contrast variation levels Cb, Cg, Cr is now specifically described. The following description refers to the use of the image signals SCb formed by the blue pixels 150B as an example. To start with, the distance information correction unit 513 sets a keypoint on each image signal SCb and a matching region centered on the keypoint. Preferably, the matching region to be set in this process has the same size as the matching region employed in step S703. From the image signals SCh in the matching region, the distance information correction unit 513 extracts a signal string along the x-direction and calculates standard deviations of the pixel values. By successively moving the signal string extraction positions in the y-direction in the matching region, the distance information correction unit 513 calculates a plurality of standard deviations. The distance information correction unit 513 takes the sum of these standard deviations as the contrast variation level Cb in the blue wavelength range. The distance information correction unit 513 performs similar processes with the image signals SCg generated by the green pixels 150G1 and 150G2 and the image signals SCr generated by the red pixels 1508, and thereby generates the contrast variation levels Cg and Cr. In step S802, it is desirable to extract signal strings along the x-direction and to generate the standard deviations of the pixel values accordingly. Since the centroid position of the first pupil region 310 and the centroid position of the second pupil region 320 are deviated along the x-direction, the direction for evaluating the contrast variation levels is preferably limited to the x-direction.

In step S803, the distance information correction unit 513 generates a correction value Cdef which corresponds to axial chromatic aberration, using the chromatic aberration information Ico and the contribution rates of the respective color information (CTBb, CTBg, CTBr). Specifically, to obtain the correction value Cdef, the chromatic aberration information in the respective wavelength ranges (Icob, Icog, Icor) contained in the chromatic aberration information Ico is synthesized, using the contribution rates of the corresponding wavelength ranges as weights. Namely, the distance information correction unit 513 generates the correction value Cdef, according to Formula (3) below.

$$\text{Correction value Cdef} = Icob \times CTBb + Icog \times CTBg + Icor \times CIBr \quad (3)$$

In step S804, the distance information correction unit 513 corrects the distance information Ird generated by the distance information generation unit 512, using the correction value Cdef generated in step S803. The correction value Cdef is obtained by weighted averaging of the amount of axial chromatic aberration at a predetermined reference wavelength, using the contribution rates of the respective wavelength ranges as weights. The distance information Ird contains the amount of defocus. Hence, the distance information correction unit 513 can correct the distance information Ird by subtracting the correction value Cdef from the distance information Ird.

The foregoing description referring to steps S802 to S804 concerns the correction of the error in the distance information Ird due to chromatic aberration. However, the process for correcting the error due to chromatic aberration should not be limited to the above-described process. For example, the contribution rates and the correction value may be obtained by other calculations. For example, as described in Japanese Patent Laid-Open No. 2011-007882, the distance information correction unit 513 may correct chromatic aberration in the image-forming optical system 120 by only using the ratio of signal values produced by image capturing pixels having different spectral sensitivity characteristics. This approach is less accurate than the case of calculating the contribution rates based on contrast variations, but requires fewer operations.

In step S805, the distance information correction unit 513 integrates the distances within each segment by the distance information Ird corrected in step S804, and generates corrected distance information Icd. If the segment contains a single representative pixel, the distance information correction unit 513 can apply the distance information of the single representative pixel to all pixels in the segment. If the segment contains two or more representative pixels, the distance information correction unit 513 can obtain distance information of all pixels in the segment by means of a certain statistic such as a mean or a median. The distance value may not necessarily be uniform in a segment. For example, suppose that the segment is in the same plane, the distance information correction unit 513 may perform plane fitting, using distance information of a plurality of representative pixels, and the thus obtained distance values of the pixels may be assigned to the respective pixels in the segment. Instead of a planar surface, the segment may have, for example, a spherical surface or any curved surface. The distance information correction unit 513 can correct the distance value in consideration of an adjacent segment. For example, if adjacent segments are highly likely to be allotted to the same object, the adjacent segments probably indicate an almost identical distance at the boundary. The normal vectors of the adjacent segments are probably close to each other. In the case of curved surface fitting, the distance information can be determined such that the boundary between adjacent segments can be connected smoothly (the inclination of the plane can change continuously). Such restrictions given to each segment can enhance the accuracy of fitting and can represent a distance change within a segment even if the segment has only one representative pixel. The distance integration process in a segment is not limited to the above-described process, and may be any process which can estimate distance information of other pixels from the distance information of the corrected representative pixel. Additionally, the distance information may not be obtained from all pixels. To give an example, the reliability of each region may be calculated in advance, and no distance information may be taken from unreliable pixels. As another possibility, some applications may not require any other distance information than the distance information from the representative pixel. In this case, the distance information correction unit 513 may omit the process in step S805 and may utilize the distance information Ird corrected in step S804 as the final corrected distance information Icd.

In the foregoing description, the distance information correction unit 513 generates the corrected distance information Icd by correcting the influence of the difference in focal points of the respective colors due to axial chromatic aberration such that an object at the saute object distance has the same amount of defocus, and by generating the thus corrected value as the corrected distance information Icd. Alternatively, the distance information correction unit 513 may generate the corrected distance information Icd by obtaining the amount of defocus in which axial chromatic aberration has been corrected, then converting the amount of defocus to a distance from the digital camera 100 to the object according to the image-forming relationship in the image-forming optical system 120, and generating the converted value as the corrected distance information Icd. The conversion from the amount of defocus to the object distance can use the paraxial amount of the image-forming optical system 120 because axial chromatic aberration is corrected before the conversion.

Further, the foregoing description mentions exemplary steps in the distance information correction process performed by the distance information correction unit 513. This correction process may be performed concurrently with a separate correction process. Examples of such a correction process include correction of the entire system by calibration.

According to the present embodiment, the distance information generating apparatus 110 performs the distance information generation process (step S530) only for the one or more representative pixels in each segment which are generated by using the color image signal SC, and can thereby reduce the number of operations. Besides, the distance information generating apparatus 110 employs the color image signal SC to select a representative pixel from near-achromatic pixels or to select representative pixels having a substantially identical color in many segments. This configuration can enhance the accuracy in correcting an error in the optical system due to chromatic aberration and can reduce the number of operations for such correction.

The digital camera 100 can utilize the final corrected distance information Icd to give feedback to the image-forming optical system 120 and the image sensor 101. The corrected distance information Icd is useful, for example, in the autofocus function. In the digital camera 100, either or both of an optical system control unit (not shown) and an image sensor control unit (not shown) calculate the amount of movement according to the corrected distance information Icd at a freely selected angle of view. Based on the thus calculated amount of movement, either or both of a focus unit driving unit (not shown) and an image sensor drive (not shown) in the digital camera 100 move a lens in the image-forming optical system 120 or move the image sensor 101. Since the digital camera 100 can obtain distance information which is less affected by chromatic aberration, just one feedback enables more accurate adjustment of the focal point.

The corrected distance information Icd can be further utilized as information for recognition of the external environment by a robot or an automobile which can autonomously create an action plan. Such a robot or an automobile converts the corrected distance information Icd to external environment recognition data by an external environment recognition unit (not shown). An action plan creation unit (not shown) creates an action plan according to the external environment recognition data and an objective assigned in advance. An actuator (not shown) and an actuator control unit (not shown) implements autonomous locomotion according to the action plane. The actuator includes an engine, an electric motor, a tire, a leg mechanism, and the like. The digital camera 100 can acquire not only the color image signal SC but also the corrected distance information Ird which is less affected by chromatic aberration, and can therefore recognize the external environment in a more stable manner.

According to the first embodiment as described above. When the digital camera 100 detects an object distance based on the first image signal S1 and the second image signal S2, the digital camera 100 is configured to select a representative pixel based on the color of the object. This configuration can enhance the accuracy in correcting an error in the object distance due to chromatic aberration and can reduce the number of operations for such correction.

Second Embodiment

Figure 9A:
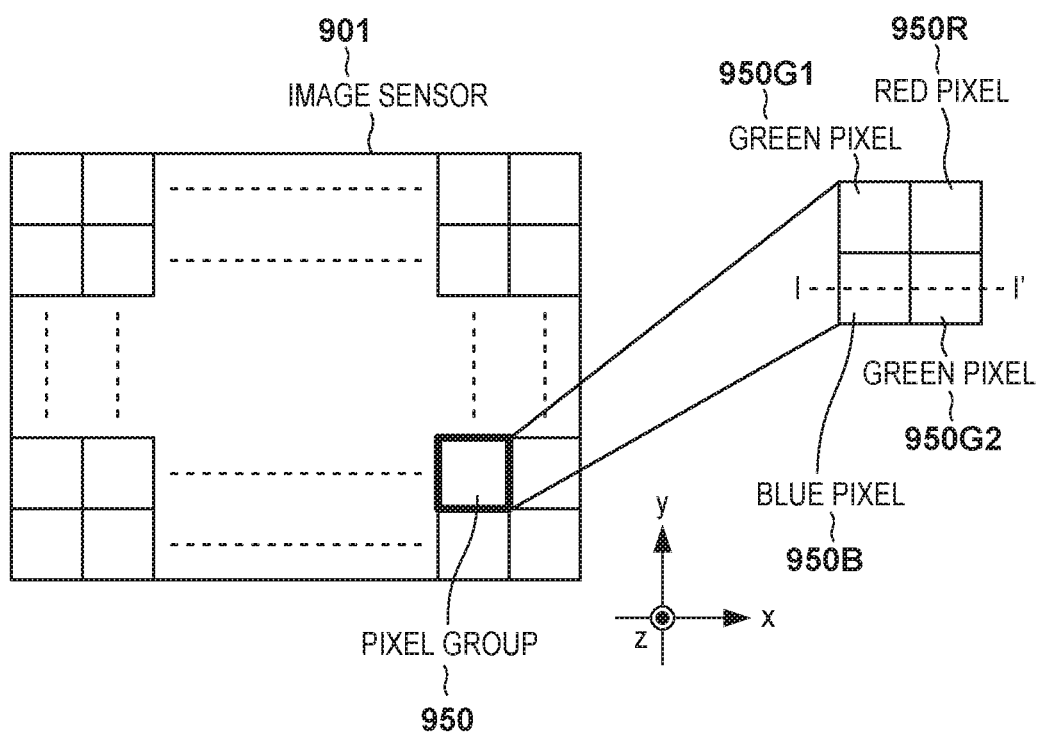
FIG. 9A is a sectional view of an image sensor 901, taken along the x-y plane.

The second embodiment employs an image sensor which has a different configuration from the image sensor 101 in the first embodiment (FIGS. 1A and 13). The configuration of the digital camera 100 in the present embodiment is basically similar to the one in the first embodiment (see FIG. 1A). However, the digital camera 100 in the present embodiment is different from the digital camera 100 in FIG. 1A in that the image sensor 101 is replaced by an image sensor 901 as shown in FIG. 9A. Further in the digital camera 100, the distance information generating apparatus 110 is replaced by a distance information generating apparatus 1010 as shown FIG. 10. The distance information generating apparatus 1010 can be implemented by a logic circuit, or can be implemented by the CPU 181, the ROM 182, and the RAM 183. In the latter case, a program stored in the ROM 182 is decompressed and executed in the RAM 183 by the CPU 181 to perform the function of the distance information generating apparatus 1010. The following description mainly mentions differences from the first embodiment.

<Configuration of the Image Sensor 901>

Figure 9B:
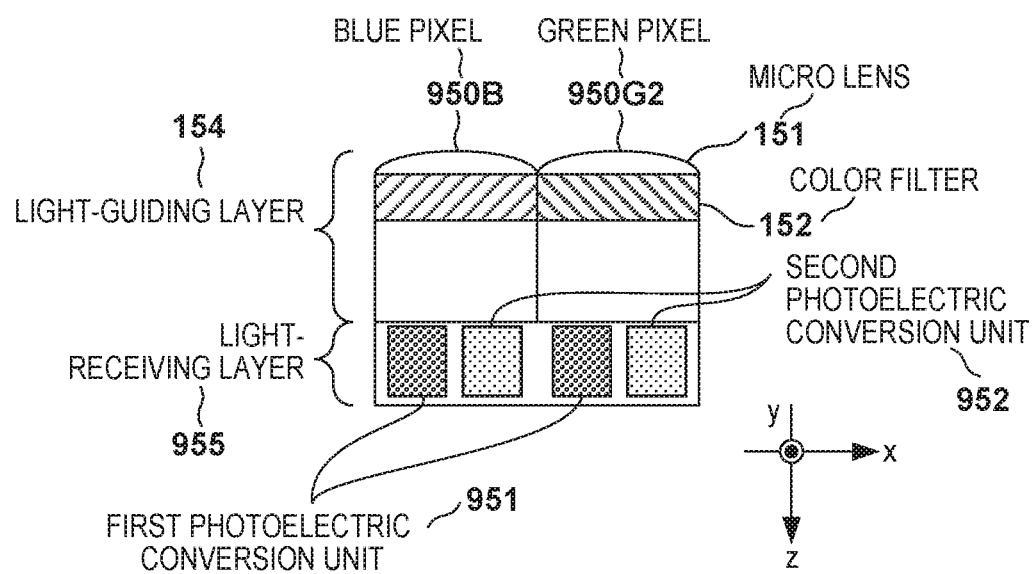
FIG. 9B is a schematic sectional view of a pixel group 950, taken along the line I-I' in FIG. 9A.

The image sensor 901 is composed of a CMOS (complementary metal-oxide semiconductor) or a CCD (charge coupled device), and has a ranging function by the image plane phase difference ranging method. When an object image is formed on the image sensor 901 via the image-forming optical system 120, the image sensor 901 photoelectrically converts the object image and generates an image signal based on the object image. The image generation unit 184 acquires the image signal, applies development processing, and generates an image signal for viewing. The image signal storage unit 185 can store the generated image signal for viewing. Referring next to FIGS. 9A and 9B, the image sensor 901 in the present embodiment is described in greater detail.

FIG. 9A is a sectional view of an image sensor 901, taken along the x-y plane. The image sensor 901 in FIG. 9A is composed of array of a plurality of pixel groups 950 each having a two-by-two pixel arrangement. Each pixel group 950 is composed of diagonally arranged green pixels 950G1 and 950G2 as well as a red pixel 950R and a blue pixel 950B as the other two pixels. The pixel arrangement and pixel colors should not necessarily be as described above, and any pattern which can somehow possess color information is applicable. The following detailed description is based on the above-mentioned pixel arrangement.

FIG. 9B is a schematic sectional view of the pixel group 950, taken along the line I-I' in FIG. 9A. In FIG. 9B, components which are the same as or similar to those shown in FIG. 2A are identified by the same reference numerals as in FIG. 2A. In each pixel, a light-receiving layer 955 is equipped with two photoelectric conversion units (a first photoelectric conversion unit 951 and a second photoelectric conversion unit 952) for photoelectrically converting received light. Each microlens 151 is arranged such that the exit pupil 130 and the light-receiving layer 955 are optically conjugated. Eventually, similar to FIG. 3A, the first photoelectric conversion unit 951 mainly receives a first ray of light 311, and the second photoelectric conversion unit 952 mainly receives a second ray of light 321.

The first photoelectric conversion unit 951 photoelectrically converts the received ray of light and generates an electric signal. Similarly, the second photoelectric conversion unit 952 photoelectrically converts the received ray of light and generates an electric signal. A third image signal is generated from a set of electric signals generated by the first photoelectric conversion units 951 of the pixels in the image sensor 901. A fourth image signal is similarly generated from a set of electric signals generated by the second photoelectric conversion units 952 of the pixels in the image sensor 901. The third image signal can provide the intensity distribution of an image formed by the first ray of light 311 on the image sensor 901, and the fourth image signal can provide the intensity distribution of an image formed by the second ray of light 321 on the image sensor 901. Since each pixel group 950 is equipped with color filters which respectively correspond to the blue, green, and red wavelength ranges, the third image signal and the fourth image signal carry color information of these three colors. In other words, the pixels in the image sensor 901 according to the present embodiment have the image capturing function as well as the ranging function.

<Actions of the Distance Information Generating Apparatus 1010>

Figure 10:
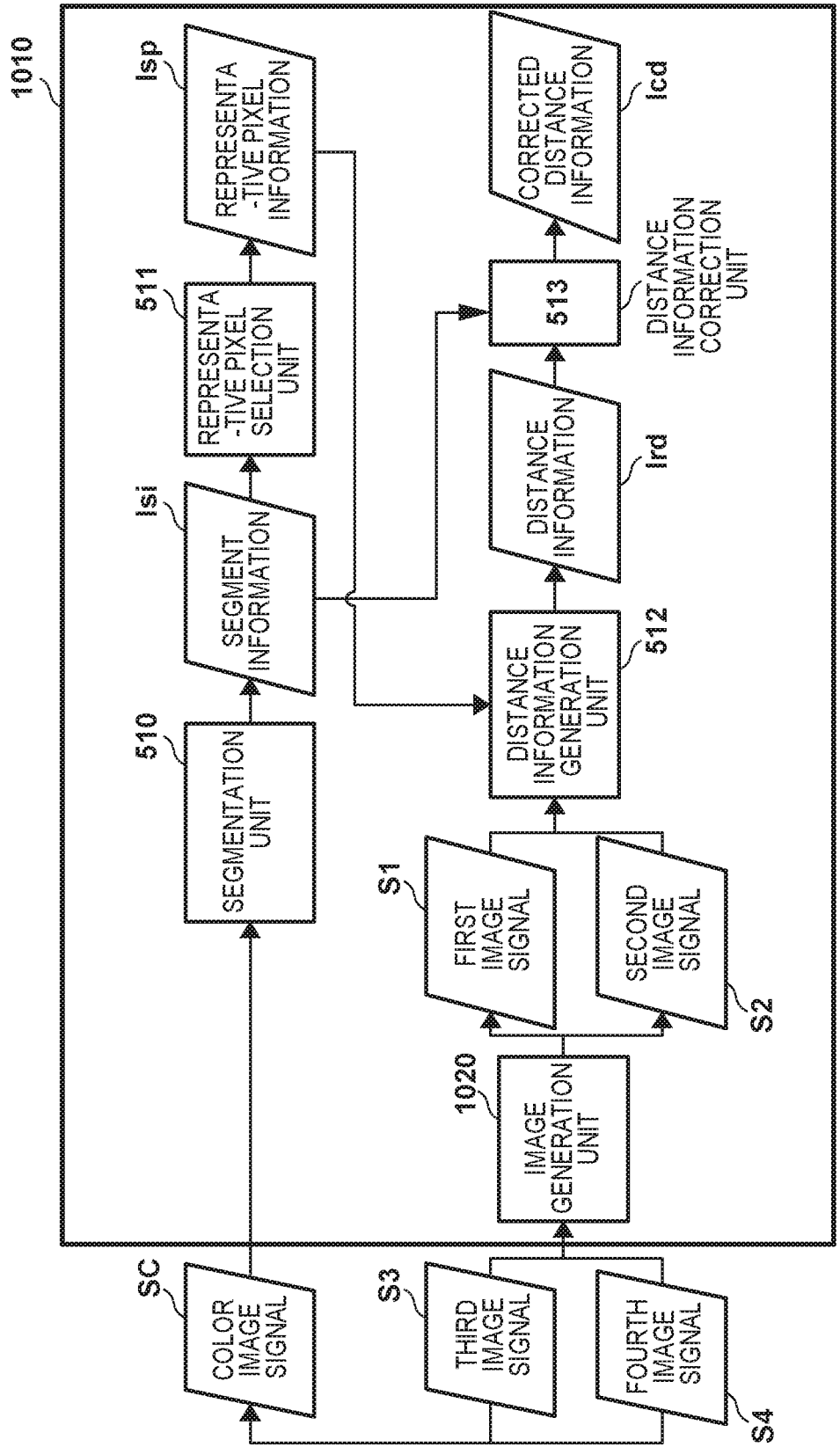
FIG. 10 is a block diagram which shows a schematic configuration of a distance information generating apparatus 1010.
Figure 11A:
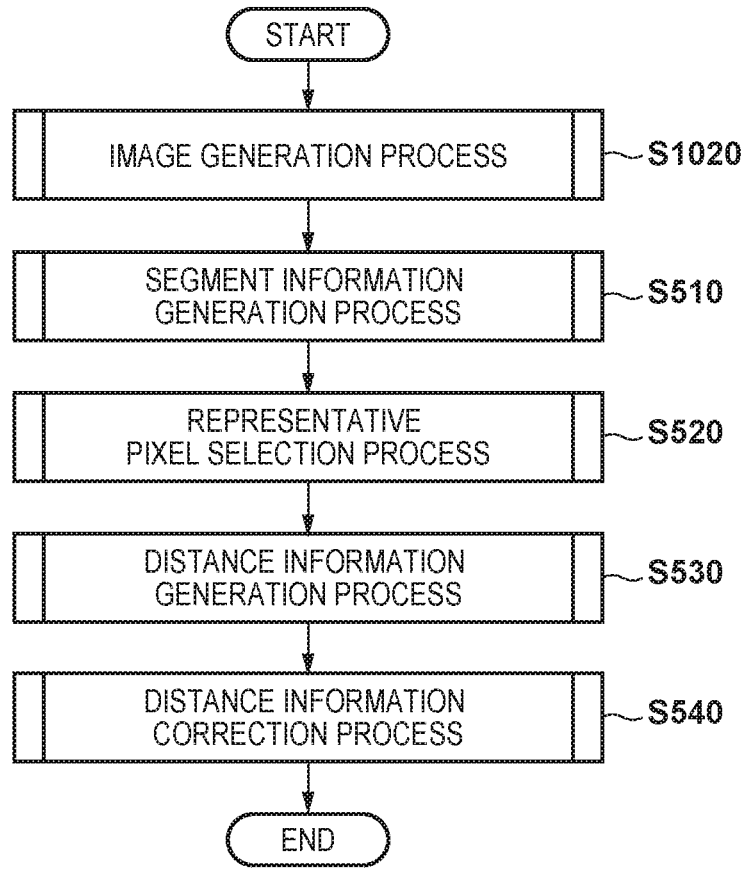
FIG. 11A is a flowchart which shows actions of the distance information generating apparatus 1010.

Now, the description turns to the distance information generating apparatus 1010 according to the present embodiment. FIG. 10 is a block diagram which shows a schematic configuration of the distance information generating apparatus 1010. FIG. 11A is a flowchart which shows actions of the distance information generating apparatus 1010. In FIG. 10, components which are the same as or similar to those shown in FIG. 5A are identified by the same reference numerals as in FIG. 5A. In FIG. 11A, process steps which are the same as or similar to those mentioned in FIG. 5B are identified by the same reference numerals as in FIG. 5B.

Compared with the distance information generating apparatus 110 in the first embodiment, the distance information generating apparatus 1010 is further equipped with an image generation unit 1020. The distance information generating apparatus 1010 acquires the third image signal S3 and the fourth image signal S4 from the image sensor 901, corrects the distance information Ird, and generates the corrected distance information Icd. As the color image signal SC, the distance information generating apparatus 1010 utilizes the third image signal S3 or the fourth image signal S4. Alternatively, the color image signal SC may be a color image signal for viewing obtained by synthesis of the third image signal S3 and the fourth image signal S4 (namely, a color image signal generated from the ray of light passing through the first pupil region 310 and the ray of light passing through the second pupil region 320, as shown in FIG. 3A).

The processes done in the segmentation unit 510, the representative pixel selection unit 511, the distance information generation unit 512, and the distance information correction unit 513 are similar to those in the first embodiment, and are not described here. The following description relates to a process performed by the image generation unit 1020.

Figure 11B:
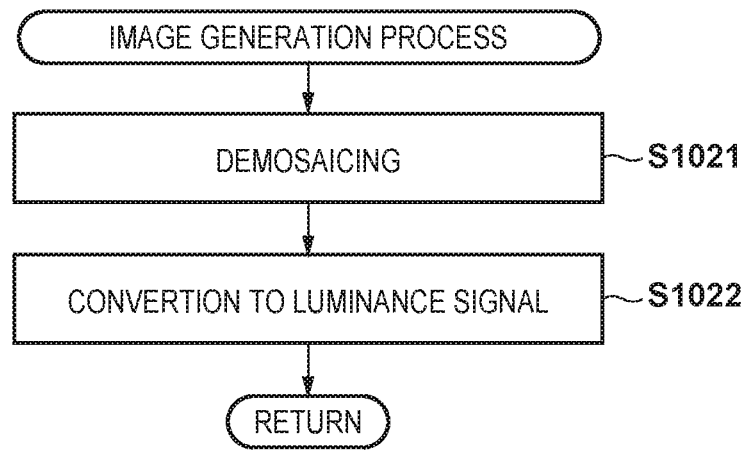
FIG. 11B is a flowchart which shows an image generation process in detail.

The image generation unit 1020 acquires the third image signal S3 and the fourth image signal S4 from the image sensor 901, and generates the first image signal S1 and the second image signal S2 The image generation process in step S1020 in FIG. 11A is now described with reference to FIG. 11B.

In step S1021, the image generation unit 1020 performs demosaicing of the third image signal S3 and the fourth image signal S4. To generate an image signal from a blue pixel, the image generation unit 1020 generates pixel values of image signals at the positions of the red pixel 950R and the green pixels 950G1, 950G2, by linear interpolation using a luminance of the adjacent blue pixel 950R For the green pixels and the red pixel, the image generation unit 1020 generates image signals at their wavelength ranges in the same manner by interpolation (e.g., bilinear interpolation or bicubic interpolation). Demosaicing allows generation of image signals containing the three-channel color information in blue, green, and red at the respective pixel positions.

In step S1022, the image generation unit 1020 generates the first image signal S1 from the third image signal S3 demosaiced in step S1021. Similarly, the image generation unit 1020 generates the second image signal S2 from the fourth image signal S4 demosaiced in step S1021. For generation of the first image signal S1, the image generation unit 1020 applies Formula (4) below to each pixel in the first image signal S1. In Formula (4), Ib represents a luminance in the blue wavelength range contained in the third image signal S3 which has been demosaiced in step S1021. Also in Formula (4), Ig represents a luminance in the green wavelength range contained in the third image signal S3 which has been demosaiced in step S1021, and Ir represents a luminance in the red wavelength range contained in the third image signal S3 which has been demosaiced in step S1021.

$$\text{Signal value of the first image signal} = Ib/4 + Ig/2 + Ir/4 \quad (4)$$

The second image signal S2 can be generated from the fourth image signal S4 which has been demosaiced in step S1021, in the same manner as the generation of the first image signal S1.

The distance information generation unit 512 generates distance information Ird from the first image signal S1 and the second image signal S2 generated by the image generation unit 1020. In the digital camera 100 of the present embodiment, each pixel group provided in the image sensor 901 is capable of acquiring both the color information and the distance information. It is therefore possible to reduce the amount of displacement between the pixel position from which the distance information is calculated and the pixel position from which the color information is obtained, and to correct chromatic aberration in the image-forming optical system 120 more accurately.

Third Embodiment

The third embodiment is configured to have two image sensors and to generate two image signals from different points of view. The following description mainly mentions differences from the second embodiment.

Figure 12A:
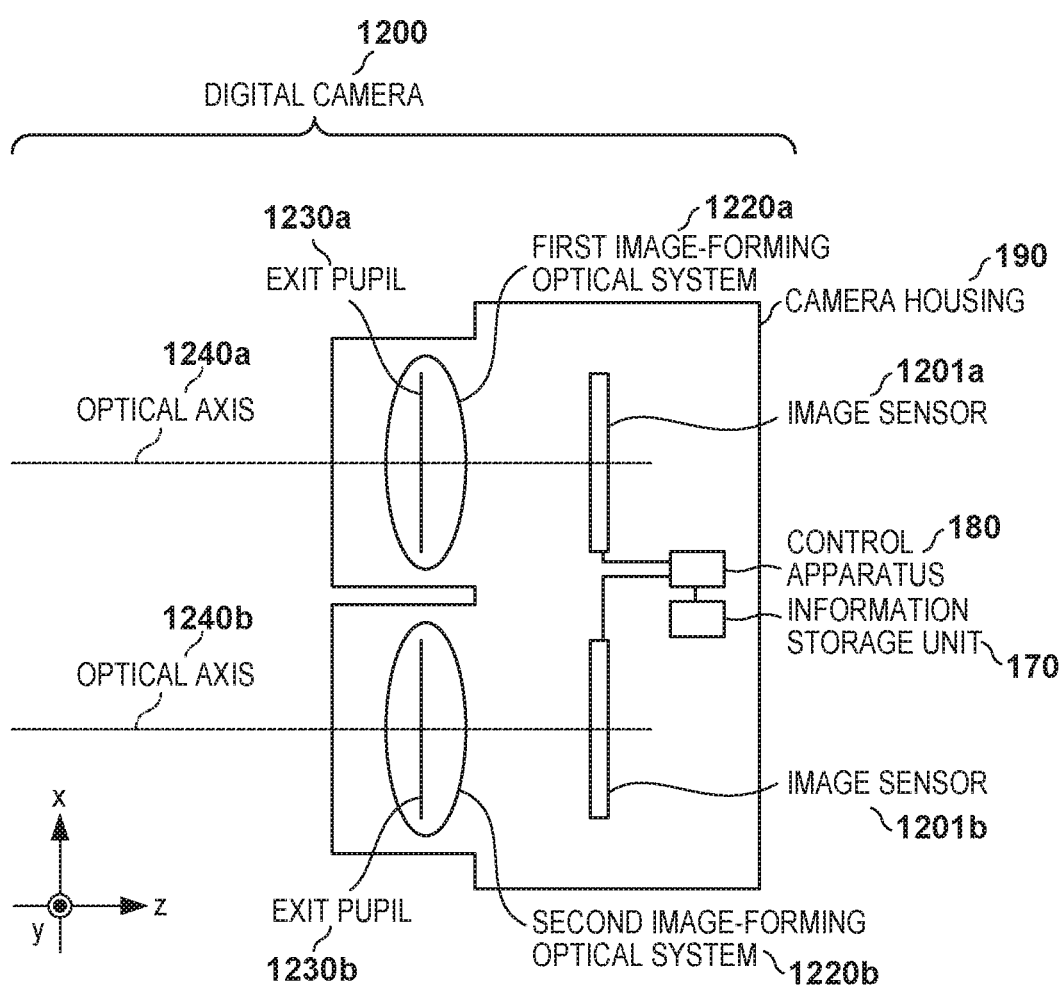
FIGS. 12A and 12B show the configuration of a digital camera 1200.

FIG. 12A shows the configuration of a digital camera 1200 according to the third embodiment. In FIG. 12A, components which are the same as or similar to those shown in FIG. 1A are identified by the same reference numerals as in FIG. 1A. The digital camera 1200 includes a first image-forming optical system 1220*a*, a second image-forming optical system 1220*b*, an image sensor 1201*a*, an image sensor 1201*b*, an information storage unit 170, and a control apparatus 180. Similar to the second embodiment, the control apparatus 180 is provided with the distance information generating apparatus 1010 as shown in FIG. 10. The first image-forming optical system 1220*a* and the second image-forming optical system 1220*b* are equipped with image-taking lenses of the digital camera 1200, and have a function of forming object images to respective image planes, i.e. the image sensor 1201*a* and the image sensor 1201*b*. The first image-forming optical system 1220*a* contains a plurality of lenses and an aperture stop, and has an exit pupil 1230*a* provided at a predetermined distance from the image sensor 1201*a*. The second image-forming optical system 1220*b* contains a plurality of lenses and an aperture stop, and has an exit pupil 1230*b* provided at a predetermined distance from the image sensor 1201*b*.

Figure 12B:
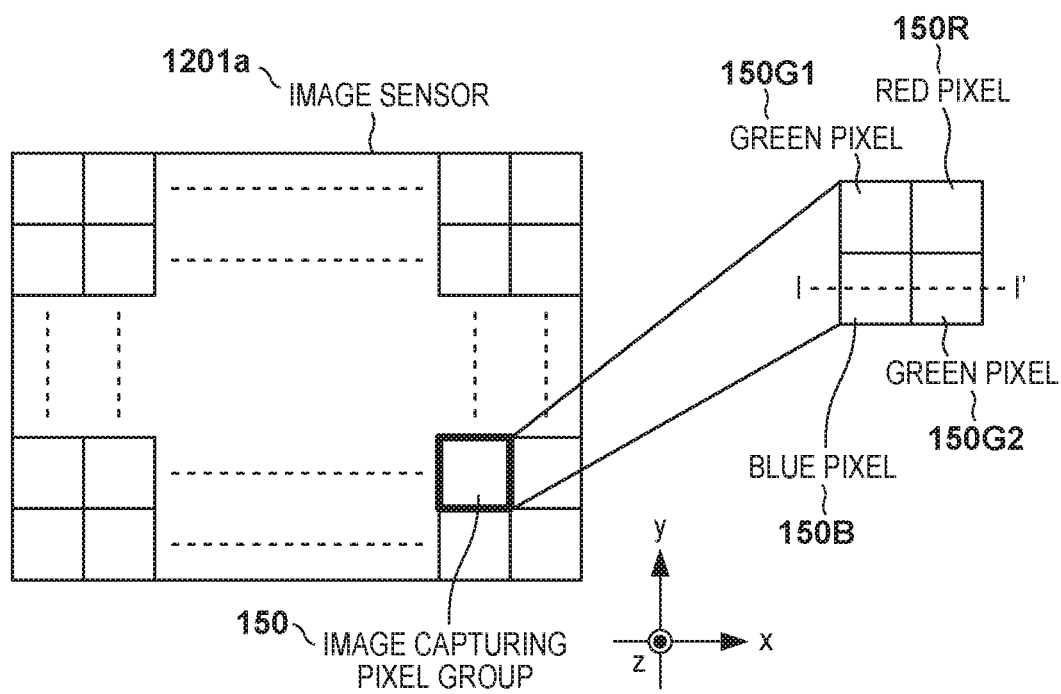

Each of the image sensor 1201*a* and the image sensor 1201*b* is composed of a CMOS (complementary metal-oxide semiconductor), a CCD (charge coupled device), or the like. FIG. 12.B is a sectional view of the image sensor 1201*a*, taken along the x-y plane. In FIG. 12B, components which are the same as or similar to those shown in FIG. 1B are identified by the same reference numerals as in FIG. 1B. The image sensor 1201*a* is composed of an array of image capturing pixel groups 150. The configuration of the image sensor 1201*b* is similar to that of the image sensor 1201*a*.

In the image sensor 1201*a*, a photoelectric conversion unit 153 of each pixel in the image capturing pixel groups 150 photoelectrically converts a received ray of light and generates an electric signal. A third image signal S3 is generated from a set of electric signals generated by the photoelectric conversion units 153 of the pixels in the image sensor 1201a. Also in the image sensor 1201b, a photoelectric conversion unit 153 of each pixel in the image capturing pixel groups 150 photoelectrically converts a received ray of light and generates an electric signal. A fourth image signal S4 is generated front a set of electric signals generated by the photoelectric conversion units 153 of the pixels in the image sensor 1201b.

The pair of the first image-forming optical system 1220a and the image sensor 1201a and the pair of the second image-forming optical system 1220b and the image sensor 1201b are positioned at a predetermined distance from each other. Owing to the separate arrangement, the third image signal S3 and the fourth image signal S4 serve as a pair of image signals for an object whose images are captured substantially at the same time from different points of view, thereby giving a certain amount of parallax according to the object distance. Since the pixels in the image sensor 1201a and the image sensor 1201b are equipped with color filters which respectively correspond to the blue, green, and red wavelength ranges, the third image signal S3 and the fourth image signal S4 carry color information of these three colors. In other words, the digital camera 1200 has the image capturing function as well as the ranging function based on the color image signals.

The distance information generating apparatus 1010 acquires the third image signal S3 from the image sensor 1201a and the fourth image signal S4 from the image sensor 1201b, corrects the influence of chromatic aberration in the image-forming optical systems 1220a and 1220b, and generates the corrected distance information Icd. Similar to the second embodiment, the distance information generating apparatus 1010 may utilize the third image signal S3 or the fourth image signal S4 as the color image signal SC in FIG. 10. Alternatively, the color image signal SC may be obtained by synthesis of the third image signal S3 and the fourth image signal S4. Unlike the digital camera 100, the digital camera 1200 mainly corrects the influence of transverse chromatic aberration in the image-forming optical system 1220a and 1220b. For this purpose, an information storage unit 170 of the digital camera 1200 stores, as chromatic aberration information, the amount of transverse chromatic aberration in the image-forming optical systems 1220a and 1220b.

The digital camera 1200 in the present embodiment arranges an optical axis 1240a acid an optical axis 1240b separately from each other, and thereby captures images of the same object from different points of view. If the optical axes 1240a and 1240b are separated widely, the amount of parallax changes by a greater increment per object distance. In other words, the digital camera 1200 can acquire the distance information more accurately.

Other Embodiments

Embodiment(s) of the present invention can also be realized by a computer of a system or apparatus that reads out and executes computer executable instructions e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-205547, filed Oct. 24, 2017, which is hereby incorporated by reference herein in its entirety.

What is claimed is:

1. A distance detecting apparatus comprising one or more processors and a memory storing a program which, when executed by the one or more processors, causes the distance detecting apparatus to function as:
    an acquisition unit configured to acquire a first image captured from a first point of view and a second image captured from a second point of view that is different from the first point of view;
    a dividing unit configured to divide the first image into a plurality of regions such that a boundary of a first region in the plurality of regions includes a boundary of a color of an object;
    a selection unit configured to select a representative pixel from each of the plurality of regions in the first image, based on the color of the object;
    a detection unit configured to detect a position in the second image corresponding to the representative pixel and thereby to detect a distance to the object corresponding to the position of the representative pixel; and
    a correction unit configured to correct an error of the distance to the object corresponding to the position of the representative pixel, the distance being detected by the detection unit, and the error being caused by chromatic aberration in an optical system employed to capture the first image and the second image,
    wherein, when selecting the representative pixel from the first region, the selection unit is configured not to select the representative pixel from a neighborhood of the boundary of the first region.

2. The distance detecting apparatus according to claim 1, wherein the selection unit is configured to select the representative pixel based on the color of the object such that a chroma of the object corresponding to the position of the representative pixel is not greater than a threshold value.

3. The distance detecting apparatus according to claim 1, wherein the acquisition unit is further configured to acquire information which indicates a particular color having small chromatic aberration, in an optical system employed to capture the first image and the second image, and wherein the selection unit is configured to select the representative pixel based on the color of the object such that a difference between the particular color and the color of the object corresponding to the position of the representative pixel is not greater than a threshold value.

4. The distance detecting apparatus according to claim 1, wherein the selection unit is configured to select the representative pixel and a second representative pixel from the first image, based on the color of the object, such that a difference between the color of the object corresponding to the position of the representative pixel and a color of the object corresponding to a position of the second representative pixel is not greater than a threshold value, and wherein the detection unit is further configured to detect a distance to the object corresponding to the position of the second representative pixel.

5. The distance detecting apparatus according to claim 4, wherein the program further causes the distance detecting apparatus to function as a dividing unit configured to divide the first image into a plurality of regions including a first region and a second region, and wherein the selection unit is configured to select the representative pixel from the first region and to select the second representative pixel from the second region.

6. The distance detecting apparatus according to claim 1, wherein the selection unit is configured to select the representative pixel from a region of the first image where contrast is not less than a threshold value.

7. The distance detecting apparatus according to claim 1, wherein the selection unit is configured to select the representative pixel such that a pixel pattern similar to a third region, which contains the representative pixel in the first image, is not present in a neighborhood of the third region.

8. The distance detecting apparatus according to claim 1, wherein the first point of view corresponds to a first pupil region of an exit pupil in an optical system employed to capture the first image and the second image, wherein the second point of view corresponds to a second pupil region of the exit pupil, wherein the acquisition unit is further configured to acquire a color image generated from a ray of light passing through the first pupil region and a ray of light passing through the second pupil region, and wherein the selection unit is configured to distinguish the color of the object, based on the color image.

9. An image capturing apparatus comprising:
the distance detecting apparatus according to claim 1; and
one or more processors and a memory storing a program which, when executed by the one or more processors, causes the image capturing apparatus to function as an image capturing unit configured to capture the first image and the second image.

10. A distance detecting method executed by a distance detecting apparatus, comprising:
acquiring a first image captured from a first point of view and a second image captured from a second point of view that is different from the first point of view;
dividing the first image into a plurality of regions such that a boundary of a first region in the plurality of regions includes a boundary of a color of an object;
selecting a representative pixel from the first image, based on the color of the object, from each of the plurality of regions;
detecting a position in the second image corresponding to the representative pixel and thereby detecting a distance to the object corresponding to the position of the representative pixel; and
correcting an error of the distance to the object corresponding to the position of the representative pixel, the distance being detected in the detecting step, and the error being caused by chromatic aberration in an optical system employed to capture the first image and the second image,
wherein, when selecting the representative pixel from the first region, said selecting step does not select the representative pixel from a neighborhood of the boundary of the first region.

11. A non-transitory computer-readable storage medium which stores a program for causing a computer to execute a distance detecting method comprising:
acquiring a first image captured from a first point of view and a second image captured from a second point of view that is different from the first point of view;
dividing the first image into a plurality of regions such that a boundary of a first region in the plurality of regions includes a boundary of a color of an object;
selecting a representative pixel from the first image, based on the color of the object, from each of the plurality of regions;
detecting a position in the second image corresponding to the representative pixel and thereby detecting a distance to the object corresponding to the position of the representative pixel; and
correcting an error of the distance to the object corresponding to the position of the representative pixel, the distance being detected in the detecting step, and the error being caused by chromatic aberration in an optical system employed to capture the first image and the second image,
wherein, when selecting the representative pixel from the first region, said selecting step does not select the representative pixel from a neighborhood of the boundary of the first region.

12. A distance detecting apparatus comprising one or more processors and a memory storing a program which, when executed by the one or more processors, causes the distance detecting apparatus to function as:
an acquisition unit configured to acquire a first image captured from a first point of view and a second image captured from a second point of view that is different from the first point of view;
a dividing unit configured to divide the first image into a plurality of regions, such that a boundary of a first region in the plurality of regions includes a boundary of a color of an object;
a selection unit configured to select a representative pixel from each of the plurality of regions in the first image, based on the color of the object such that influence of chromatic aberration is reduced;
a detection unit configured to detect a position in the second image corresponding to the representative pixel and thereby to detect a distance to the object corresponding to the position of the representative pixel,
wherein, when selecting the representative pixel from the first region, the selection unit is configured not to select the representative pixel from a neighborhood of the boundary of the first region.

13. The distance detecting apparatus according to claim 12, wherein the selection unit is configured to select the representative pixel based on the color of the object such that a chroma of the object corresponding to the position of the representative pixel is not greater than a threshold value.

14. The distance detecting apparatus according to claim 12, wherein the acquisition unit is further configured to acquire information which indicates a particular color having small chromatic aberration, in an optical system employed to capture the first image and the second image, and wherein the selection unit is configured to select the representative pixel based on the color of the object such that a difference between the particular color and the color of the object corresponding to the position of the representative pixel is not greater than a threshold value.

15. A distance detecting apparatus comprising one or more processors and a memory storing a program which, when executed by the one or more processors, causes the distance detecting apparatus to function as:
   an acquisition unit configured to acquire a first image captured from a first point of view and a second image captured from a second point of view that is different from the first point of view;
   a dividing unit configured to divide the first image into a plurality of regions, such that a boundary of a first region in the plurality of regions includes a boundary of a color of an object;
   a selection unit configured to select a representative pixel from each of the plurality of regions in the first image, based on the color of the object;
   a detection unit configured to detect positions in the second image corresponding to the representative pixels selected from the plurality of regions and thereby to generate a distance distribution, to the object corresponding to the positions of the representative pixels, in which influence of chromatic aberration is corrected,
   wherein, when selecting the representative pixel from the first region, the selection unit is configured not to select the representative pixel from a neighborhood of the boundary of the first region.

16. The distance detecting apparatus according to claim 15, wherein the program further causes the distance detecting apparatus to function as a dividing unit configured to divide the first image into the plurality of regions.

17. The distance detecting apparatus according to claim 15, wherein the first point of view corresponds to a first pupil region of an exit pupil in an optical system employed to capture the first image and the second image, wherein the second point of view corresponds to a second pupil region of the exit pupil, wherein the acquisition unit is further configured to acquire a color image generated from a ray of light passing through the first pupil region and a ray of light passing through the second pupil region, and wherein the selection unit is configured to distinguish the color of the object, based on the color image.

* * * * *